(12) United States Patent
Jiang et al.

(10) Patent No.: US 11,545,507 B2
(45) Date of Patent: Jan. 3, 2023

(54) MEMORY DEVICE AND METHOD FOR MAKING SAME

(71) Applicant: Taiwan Semiconductor Manufacturing Company, Ltd., Hsinchu (TW)

(72) Inventors: Yu-Wei Jiang, Hsinchu (TW); Hung-Chang Sun, Kaohsiung (TW); Kuo-Chang Chiang, Hsinchu (TW); Sheng-Chih Lai, Hsinchu County (TW); TsuChing Yang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 113 days.

(21) Appl. No.: 17/199,453

(22) Filed: Mar. 12, 2021

(65) Prior Publication Data
US 2022/0037364 A1 Feb. 3, 2022

Related U.S. Application Data

(60) Provisional application No. 63/058,431, filed on Jul. 29, 2020.

(51) Int. Cl.
*H01L 27/11582* (2017.01)
*H01L 27/11597* (2017.01)
*H01L 21/02* (2006.01)
*H01L 29/24* (2006.01)

(52) U.S. Cl.
CPC .. *H01L 27/11597* (2013.01); *H01L 21/02565* (2013.01); *H01L 21/02631* (2013.01); *H01L 27/11582* (2013.01); *H01L 29/24* (2013.01)

(58) Field of Classification Search
CPC ......... H01L 27/11597; H01L 21/02565; H01L 21/02631; H01L 27/11582; H01L 29/24; H01L 27/11551; H01L 29/66969; H01L 29/7869; H01L 27/11578; H01L 27/11565; H01L 27/11568; H01L 27/11587; H01L 27/1159
See application file for complete search history.

(56) References Cited

U.S. PATENT DOCUMENTS

2013/0134492 A1 * 5/2013 Yang ................. H01L 27/11582
257/314

* cited by examiner

*Primary Examiner* — David Vu
(74) *Attorney, Agent, or Firm* — JCIPRNET

(57) ABSTRACT

A memory device includes a substrate, word line layers, insulating layers, and memory cells. The word line layers are stacked above the substrate. The insulating layers are stacked above the substrate respectively alternating with the word line layers. The memory cells are distributed along a stacking direction of the word line layers and the insulating layers perpendicularly to a major surface of the substrate. Each memory cell includes a source line electrode and a bit line electrode, a first oxide semiconductor layer, and a second oxide semiconductor layer. The first oxide semiconductor layer is peripherally surrounded by one of the word line layers, the source line electrode, and the bit line electrode. The second oxide semiconductor layer is disposed between the one of the word line layers and the first oxide semiconductor layer.

20 Claims, 23 Drawing Sheets

MEMORY DEVICE AND METHOD FOR MAKING SAME

CROSS-REFERENCE TO RELATED APPLICATION

This application claims the priority benefit of U.S. provisional applications Ser. No. 63/058,431, filed on Jul. 29, 2020. The entirety of the above-mentioned patent application is hereby incorporated by reference herein and made a part of this specification.

BACKGROUND

A memory device is formed as an array of memory elements throughout multiple layers stacked above a semiconductor substrate. The stack of memory elements forms a high integration density of a three-dimensional (3D) non-volatile memory device that is used in various electronic apparatuses such a memory chip, a solid-state drive, or a storage device for various computational applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
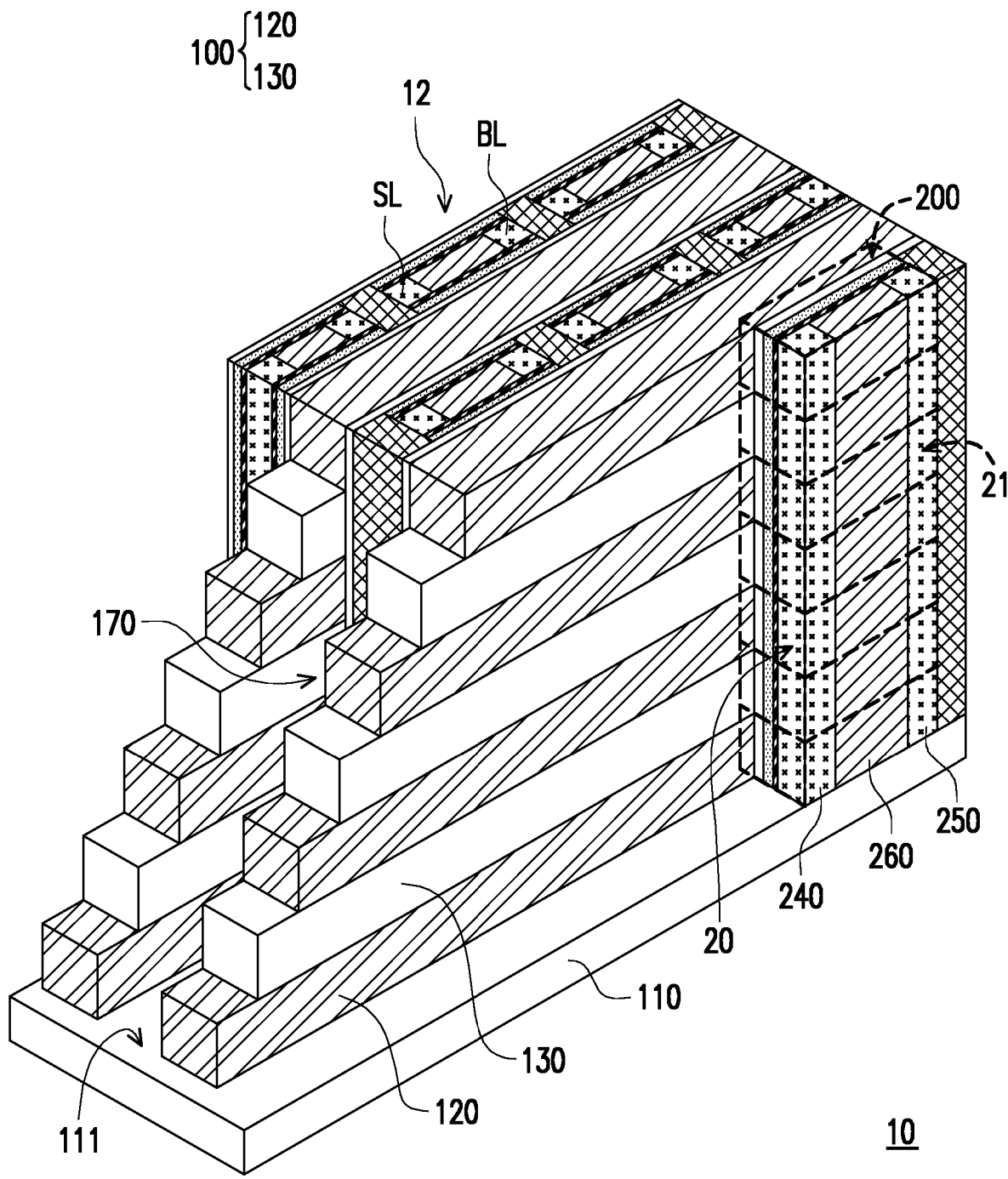
FIG. 1 is a schematic three-dimensional (3D) view illustrating a memory device in accordance with some embodiments of the disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Figure 2:
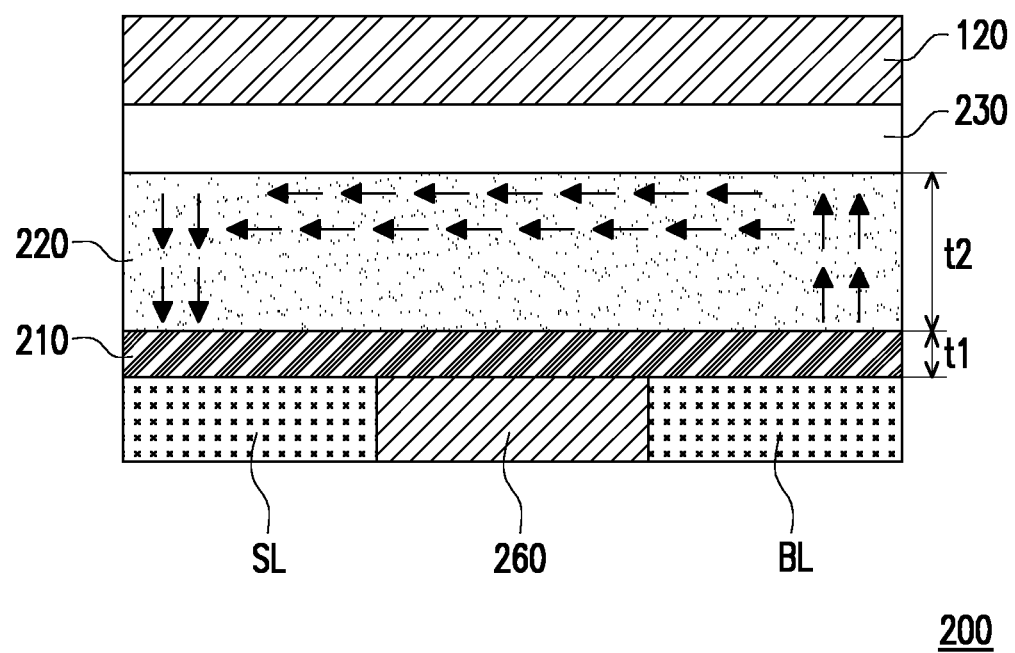
FIG. 2 is a schematic view illustrating a memory cell in accordance with some embodiments of the disclosure.

FIG. 1A is a schematic three-dimensional (3D) view illustrating a memory device 10 in accordance with some embodiments of the disclosure. FIG. 2 is a schematic view illustrating a memory cell 200 in accordance with some embodiments of the disclosure. Referring to FIG. 1 and FIG. 2, in some embodiments, a 3D memory device 10 includes a plurality of memories 20 disposed over a substrate 110. The memories 20 comprise a plurality of word line layers 120, a plurality of insulating layers 130, and a plurality of memory cell strings 21. In the present embodiment, the word line layers 120 are stacked above the substrate 110. The insulating layers 130 are stacked above the substrate 110 respectively alternating with the word line layers 120. As illustrated, each of the memory cell strings 21 includes the memory cells 200 vertically distributed along a stacking direction of the word line layers 120 and the insulating layers 130 perpendicularly to a major surface 111 of the substrate 110. In some embodiments, a plurality of isolation trenches 170 are formed between the stack of the word line layers 120 and the insulating layers 130 for constituting a plurality of cell regions that accommodate the memory cells 200 therein. In some embodiments, the substrate 110 may be a semiconductor substrate, such as a bulk semiconductor substrate, a semiconductor-on-insulator (SOI) substrate, or the like, which may be doped (e.g., with a p-type or an n-type dopant) or undoped. The substrate 110 may be an integrated circuit die, such as a logic die, a memory die, an ASIC die, or the like. The substrate 110 may be a complementary metal oxide semiconductor (CMOS) die and may be referred to as a CMOS under array (CUA). The substrate 110 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

In some embodiments, circuits are formed over the substrate 110. The circuits may include transistors formed at a top surface of the substrate 110. In some embodiments, the above-mentioned transistors include front-end transistors fabricated through front end of line (FEOL) processes, wherein the front-end transistors may be or include fin field effect transistors (FinFETs), nanostructure (e.g., nanosheet, nanowire, gate-all-around, or the like) FETS (nano-FETs), planar FETs, the like, or combinations thereof. The front-end transistors may be formed by gate-first processes or gate-last processes. In some alternative embodiments, the circuits formed over the substrate 110 include front-end transistors fabricated through front end of line (FEOL) processes and back-end transistors fabricated through back end of line (BEOL) processes, wherein the back-end transistors (e.g., thin film transistors) are formed above the front-end transistors (e.g., FinFET, nanostructure FETS, planar FETs, the like, or combinations thereof).

In some embodiments, the word line layers 120 are conductive layers that can include one or more conductive materials containing semiconductor materials such as polysilicon material or metal materials. In some embodiments, the metal materials used for the word line layers 120 can include Cu, Al, Ti, W, Ni, Au, Co, Ta, Mo, Pd, PT. Ru, Ir, TiN, TaN, TaC, NbN, MoTi, NiCuTi, CuMn, CuMgAl, RuTa, or a combination thereof. In the present embodiment, the word line layers 120 made of the above-mentioned metal materials can have an advantage in electrical resistivity over a similar structure formed of semiconductor materials.

Specifically, in the present embodiment, the metal materials have a lower electrical resistivity compared to the doped semiconductor materials, for example, doped polysilicon. In addition, the word line layers 120 formed by the above metal materials provide a lower electrical resistivity compared to the doped polysilicon without a need for temperature activation. Hence, the word line layers 120 including the metal materials have an advantage for charging and discharging the gate capacitance of the memory cell such that a faster memory device can be provided. Using the metal materials for forming the word line layers 120 removes the carrier depletion effect commonly found in, for example, the semiconductor material such as polysilicon. The carrier depletion effect is also referred to as the poly depletion effect. The reduction of poly depletion effect in the word line layers 120 is beneficial for improving data retention.

In some embodiments, the insulating layers 130 are isolation layers disposed between each two adjacent word line layers 120 to form alternative stacked layers. In some embodiments, the insulating layers 130 may include a dielectric material adapted for electrically isolating the adjacent word line layers 130, for example, silicon nitride ($SiN_x$), silicon oxide ($SiO_x$), silicon oxynitride ($SiO_xN_y$), magnesium oxide (MgO), aluminum oxide ($Al_2O_3$), silicon carbide (SiC), or a combination thereof. In some other embodiments, the insulating layers 130 can include low-k dielectric materials, for example, carbon doped silicon oxide and porous silicon oxide. In some embodiments not illustrated, the insulting layers 130 can also include airgaps for insulation.

Referring again to FIG. 1 and FIG. 2, the memory cells 200 are respectively disposed in a cell array region 12 of the memory device 10 to form a 3D memory array. As illustrated in FIG. 2, in some embodiments, each of the memory cells 200 includes a source line electrode SL, a bit line electrode BL, a first oxide semiconductor layer 210, and a second oxide semiconductor layer 220. The source line electrode SL is extended in each of the memory cells 200 and extended perpendicularly to the major surface 111 of the substrate 110. In some embodiments, the bit line electrode BL is laterally aligned with the source line electrode SL along one of the word line layers 120. As illustrated in FIG. 1 and FIG. 2, a source line electrode strip 240 includes a plurality of source line electrodes SL vertically aligned along the stacking direction of the word line layers 120 and the insulating layers 130. Moreover, a bit line electrode strip 250 includes a plurality of bit line electrodes BL vertically aligned along the source line electrodes SL.

As illustrated in FIG. 2, in a memory cell 200, the first oxide semiconductor layer 210 is peripherally surrounded by one of the word line layers 120, the source line electrode SL, and the bit line electrode BL. Moreover, the second oxide semiconductor layer 220 is disposed between the one of the word line layers 120 and the first oxide semiconductor layer 120. In some embodiments, referring to FIG. 1 and FIG. 2, the memory cell 200 can further include a high-k dielectric layer 230 disposed between the second oxide semiconductor layer 220 and the word line layer 120. In the present embodiment, the high-k dielectric layer 230 can be an insulating layer formed by, for example, a HfZrO (HZO) layer. In addition, a side wall oxide layer 260 formed by, for example, a silicon oxide layer can be disposed between the source line electrode SL and the bit line electrode BL. Through the above configuration illustrated in FIG. 2, a thin film transistor (TFT) can be formed in each of the memory cells 200.

In some embodiments, the first oxide semiconductor layer 210 and the second oxide semiconductor layer 220 are formed by different materials. In addition, the first oxide semiconductor layer 210 and the second oxide semiconductor layer 220 can be respectively formed by, for example, a sputtering process. In some embodiments, the first oxide semiconductor layer 210 can include, for example, oxygen compounds containing Ga, Zn, such as, $Ga_yZn_zMO$, wherein M can be Si, Mg, Ti, or Ca. In some embodiments, the first oxide semiconductor layer 210 can be adopted as an insulator like layer disposed on the second oxide semiconductor layer 220 in a crystalline phase or in an amorphous phase.

In some embodiments, the second oxide semiconductor layer 220 can include oxygen compounds containing In, Ga, and Zn, such as $In_xGa_yZn_zMO$, wherein M can be Ti, Al, Ag, Si, Sn, and x, y, z are the numbers respectively less than 1 and larger than 0. In some other embodiments, the second oxide semiconductor layer 220 can also include at least one of metal oxide based semiconductor material such as IGZO, IZO, ITO, AZO, GZO, or a mixture thereof.

As illustrated in FIG. 2, in some embodiments, a thickness t1 of the first oxide semiconductor layer 210 is less than or substantially equal to a thickness t2 of the second oxide semiconductor layer 220. Moreover, in some embodiments, a carrier concentration in the first oxide semiconductor layer 210 is in a range from about $10^{14}$ $cm^{-3}$ to about $10^{15}$ $cm^{-3}$. In some embodiments, a carrier concentration in the second oxide semiconductor layer 220 is ranged from about $10^{16}$ $cm^{-3}$ to about $10^{20}$ $cm^{-3}$. As illustrated in FIG. 2, an electron current following an arrow direction flows from the bit line electrode BL to the source line electrode SL.

In configurations (not illustrated) in which only a single oxide semiconductor layer is disposed between a high-k dielectric layer and a source line electrode and between the high-k dielectric layer and a bit line electrode, the single oxide semiconductor layer has a front surface and a back surface opposite to each other, and the back surface abuts the high-k dielectric layer. In addition, the front surface is an interface between the single oxide semiconductor layer and the source line electrode and between the single oxide semiconductor layer and the bit line electrode. As only the single oxide semiconductor layer is disposed, a disorder might be induced on the abovementioned interface. The above-mentioned disordered surface between the single oxide semiconductor layer and the source line electrode and between the single oxide semiconductor layer and the bit line electrode can induce plasma damage moisture absorption, and/or metal and hydrogen diffusion from adjacent layers. The above-mentioned unwanted reactions can generate the defects including oxygen vacancies and thus consequently entry of hydrogen to the single oxide semiconductor layer or extraction of oxygen contained in the single oxide semiconductor layer is caused. Therefore, the above single semiconductor layer can have lower resistance, and a parasitic channel can be formed. In the single oxide semiconductor layer, carrier concentration will be increased due to a low resistance, and thus the carrier transport between the source line electrode and the bit line electrode may be unstable in the transistor formed in a memory cell.

In the embodiment illustrated in FIG. 2, a dual oxide semiconductor layer structure, including the first oxide semiconductor layer 210 and the second oxide semiconductor 220, is disposed between the high-k dielectric layer 230 and the source line electrode SL and between the high-k dielectric layer 230 and the bit line electrode BL. In the present embodiment, the first oxide semiconductor layer 210 has a higher barrier property compared to the second oxide semiconductor layer 220. Through configuring the first oxide semiconductor layer 210 between the second oxide semiconductor layer 220 and the source line electrode SL, between the second oxide semiconductor layer 220 and the side wall oxide layer 260, and between the second oxide semiconductor layer 220 and the bit line electrode BL, the excess carrier generated by metal diffusion, plasma damage, moisture absorption, and/or hydrogen diffusion can be effectively inhibited. Moreover, through configuring the above dual layer oxide semiconductor layer including the first oxide semiconductor layer 210 and the second oxide semiconductor layer 220, the depletion of the back-channel current can be easily controlled, and thereby the device stability during processing can be further enhanced.

In some embodiments, as illustrated in FIG. 1, the memory device 10 can be constituted by a memory array including a plurality of the memories 20. Each memory 20 has the memory cell 200 disposed in the stack 100 including the word line layers 120 and the insulating layers 130, and the word line layers 120 and the insulating layers 130 are stacked in an alternated manner. In addition, the memory array includes the cell array region 12 disposed in the stack 100 of the word line layers 120 and the insulating layers 130.

As illustrated in FIG. 1. the cell array region 12 includes the isolation trenches 170 and a plurality of memory cell strings 21 disposed therein. Each of the memory cell strings 21 includes a plurality of memory cells 200 aligned along the stacking direction of the word line layers 120 and the insulating layers 130. The two adjacent memory cells 200 vertically aligned along the stacking direction are insulated by the insulating layers 130. The isolation trenches 170 are extended through the stack 100 of the word line layers 120 and the insulating layers 130 perpendicularly to the major surface 111 of the substrate 110. As illustrated in FIG. 1, the memory cell strings 21 of the memories 20 are respectively disposed within the isolation trenches 170. Each of the memory cell strings 21 includes a source line electrode strip 240, a bit line electrode strip 250, the first oxide semiconductor layer 210, and the second oxide semiconductor layer 220. As illustrated in FIG. 1, the source line electrode strip 240 is extended through the stack 100 to the major surface 111 of the substrate 110. The bit line electrode strip 240 is laterally aligned with the source line electrode trip 250 along the isolation trenches 170 and extended through the stack 100 to the major surface 111 of the substrate 110. The stack 100 in FIG. 1 is merely for illustration purpose and reducing the complexity of drawings. Hence, the number of layers of the word line layers 120 and the insulating layers 130 of the stack 100 should not be limited to the present embodiment illustrated in FIG. 1. The number of layers of the stack 100 can be adjusted based on the practical needs of the memory device 10.

As illustrated in FIG.1, the first oxide semiconductor layer 210 is extended through the stack 100 to the major surface 111 of the substrate 110. In addition, the first oxide semiconductor layer 210 is peripherally surrounded by the alternatively stacked word line layers 120 and insulating layers 130, the source line electrode strip 240, and the bit line electrode strip 250. Moreover, the second oxide semiconductor layer 220 is disposed between the first oxide semiconductor layer 210 and the stack 100 of the word line layers 120 and the insulting layers 130.

Figure 3A:
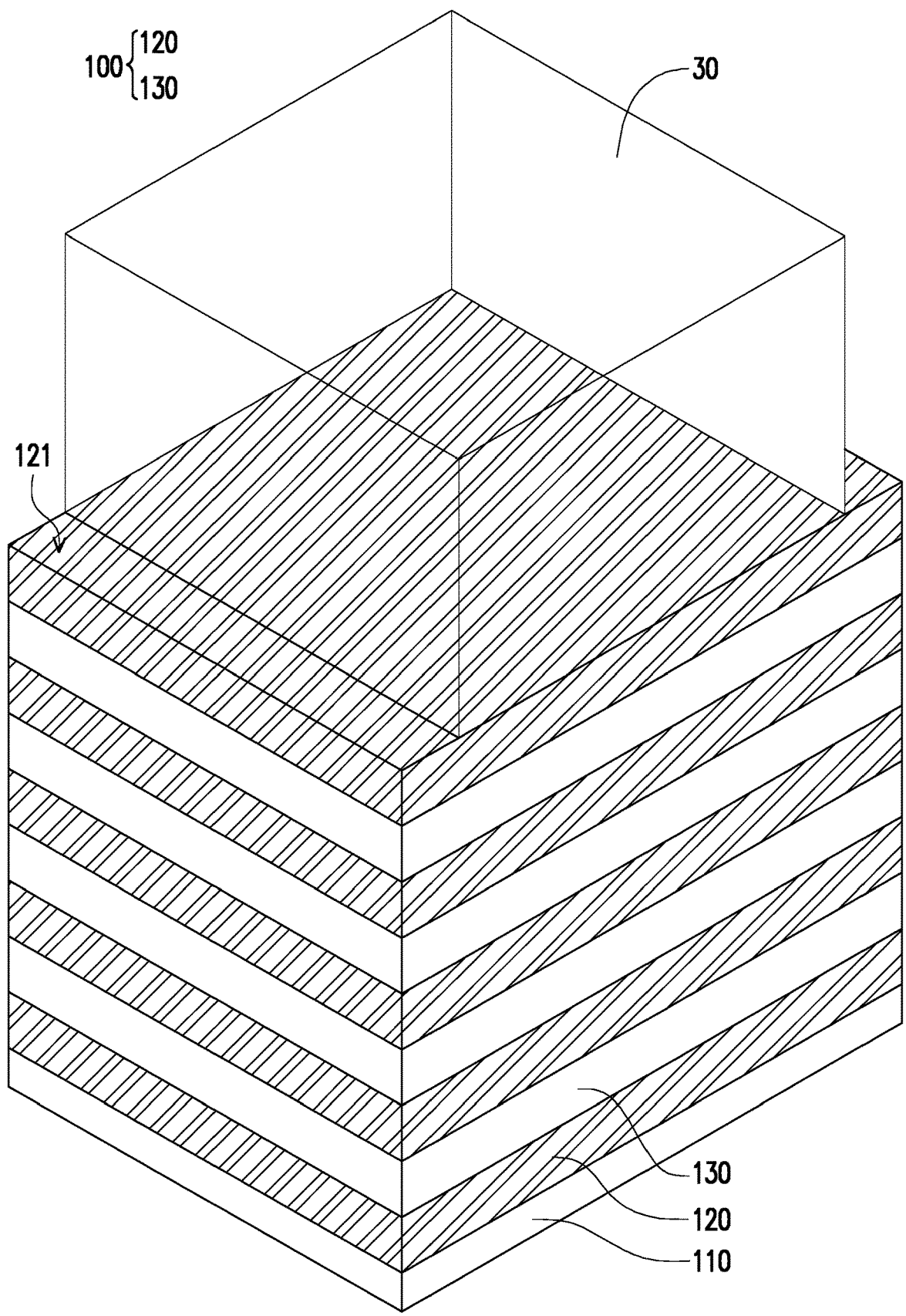
FIG. 3A is a schematic 3D view illustrating a stack of word line layers and insulating layers for a manufacturing step thereof in accordance with some embodiments of the disclosure.

FIG. 3A is a schematic three-dimensional 3D view illustrating a stack 100 of word line layers 120 and insulating layers 130 for a manufacturing step thereof in accordance with some embodiments of the disclosure. Referring to FIG. 3A, a manufacturing method of the memory device 10 shown in FIG. 1 includes firstly forming the substrate 110 by, for example, a silicon (Si) substrate, an indium phosphide (InP) substrate, a germanium (Ge) substrate, a gallium arsenide (GaAs) substrate, a gallium arsenide phosphide (GaAsP) substrate, or a silicon germanium (SiGe) substrate. In the present embodiments, the word line layers 120 and the insulating layers 130 are subsequently formed in alternation above the substrate 110.

In some embodiments, the word line layers 120 and the insulating layers 130 stacked in an alternated manner can be formed by using suitable deposition techniques, for example, atomic layer deposition (ALD), physical vapor deposition (PVD), chemical vapor phase deposition (CVD), and/or sputtering. In some embodiments, the alternating stacked word line layers 120 and the insulating layers 130 can be formed by low pressure CVD (LPCVD) or alternative plasma enhanced CVD (PECVD). In some embodiments, the word line layers 120 include the metal materials formed by the deposition methods of, for example, metal evaporation, sputtering, chemical vapor deposition (CVD), and/or atomic layer deposition (ALD).

Figure 3B:
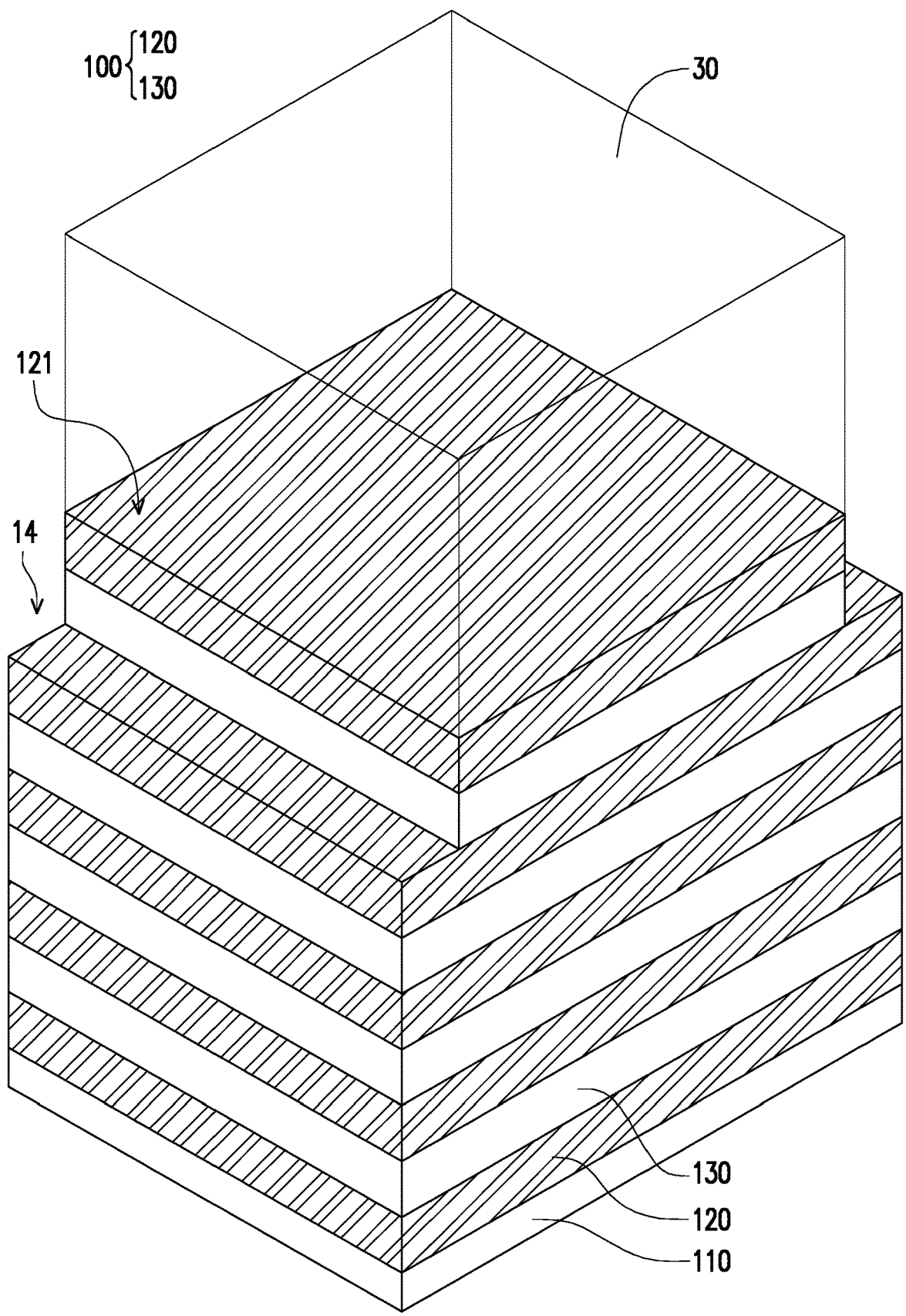
FIG. 3B is a schematic 3D view illustrating a stack of word line layers and insulating layers for a manufacturing step thereof in accordance with some embodiments of the disclosure.

FIG. 3B is a schematic three-dimensional (3D) view illustrating a stack 100 of word line layers 120 and insulating layers 130 for a manufacturing step thereof in accordance with some embodiments of the disclosure. Referring to FIG. 3A and FIG. 3B, a staircase region 14 is formed in the stack 100 of the word line layers 120 and the insulating layers 130.

As illustrated in FIG. 3A, a photoresist mask 30 can be formed over the top surface 121 of the stack 100 and patterned to expose a portion of the top surface 121. As illustrated in FIG. 3B, an anisotropic etch process, such as a reactive ion etch (RIE) process or other dry etch process, can be performed to remove a portion of the stack 100 exposed from the photoresist mask 30.

Figure 3C:
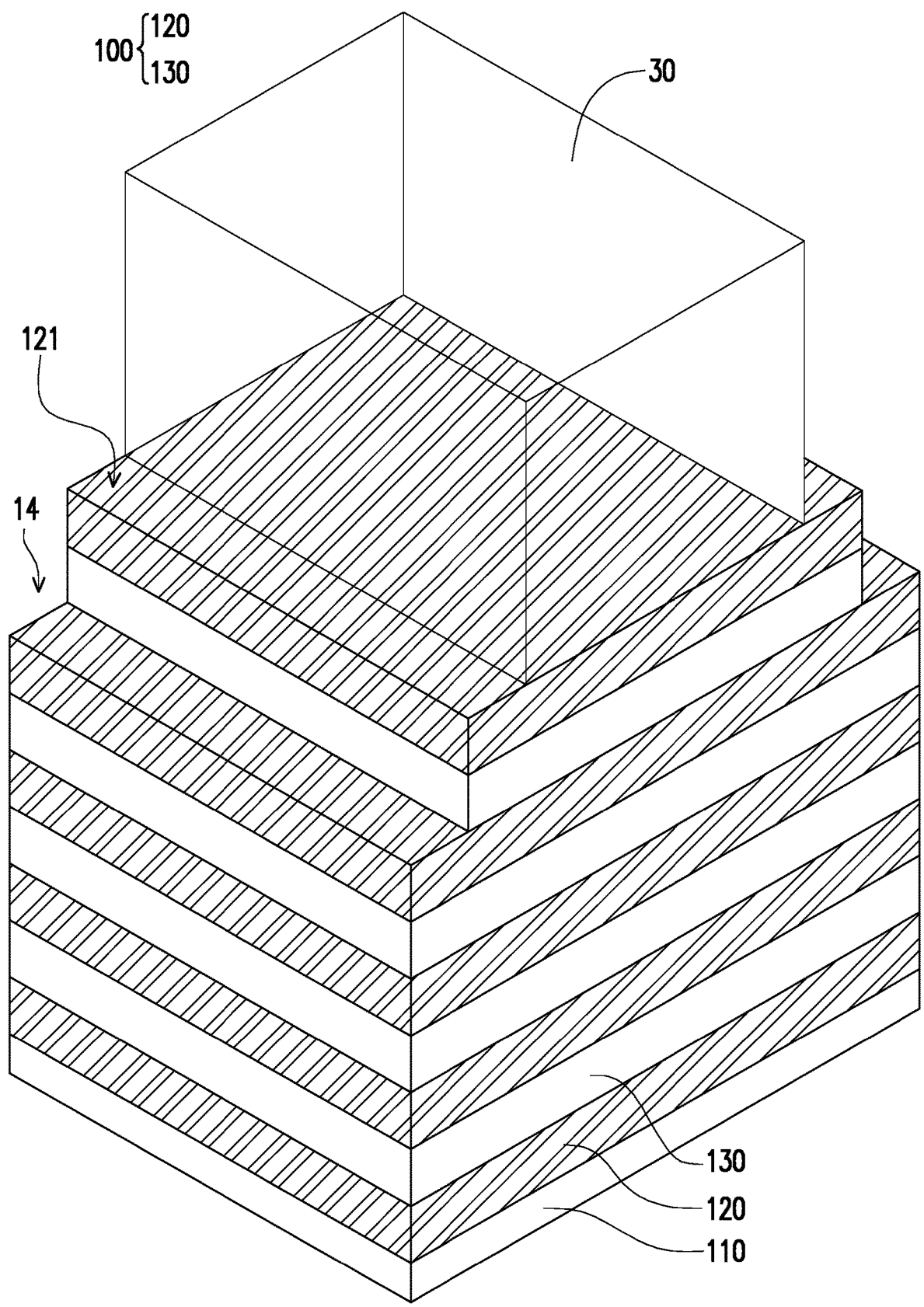
FIG. 3C is a schematic 3D view illustrating a stack of word line layers and insulating layers for a manufacturing step thereof in accordance with some embodiments of the disclosure.
Figure 3D:
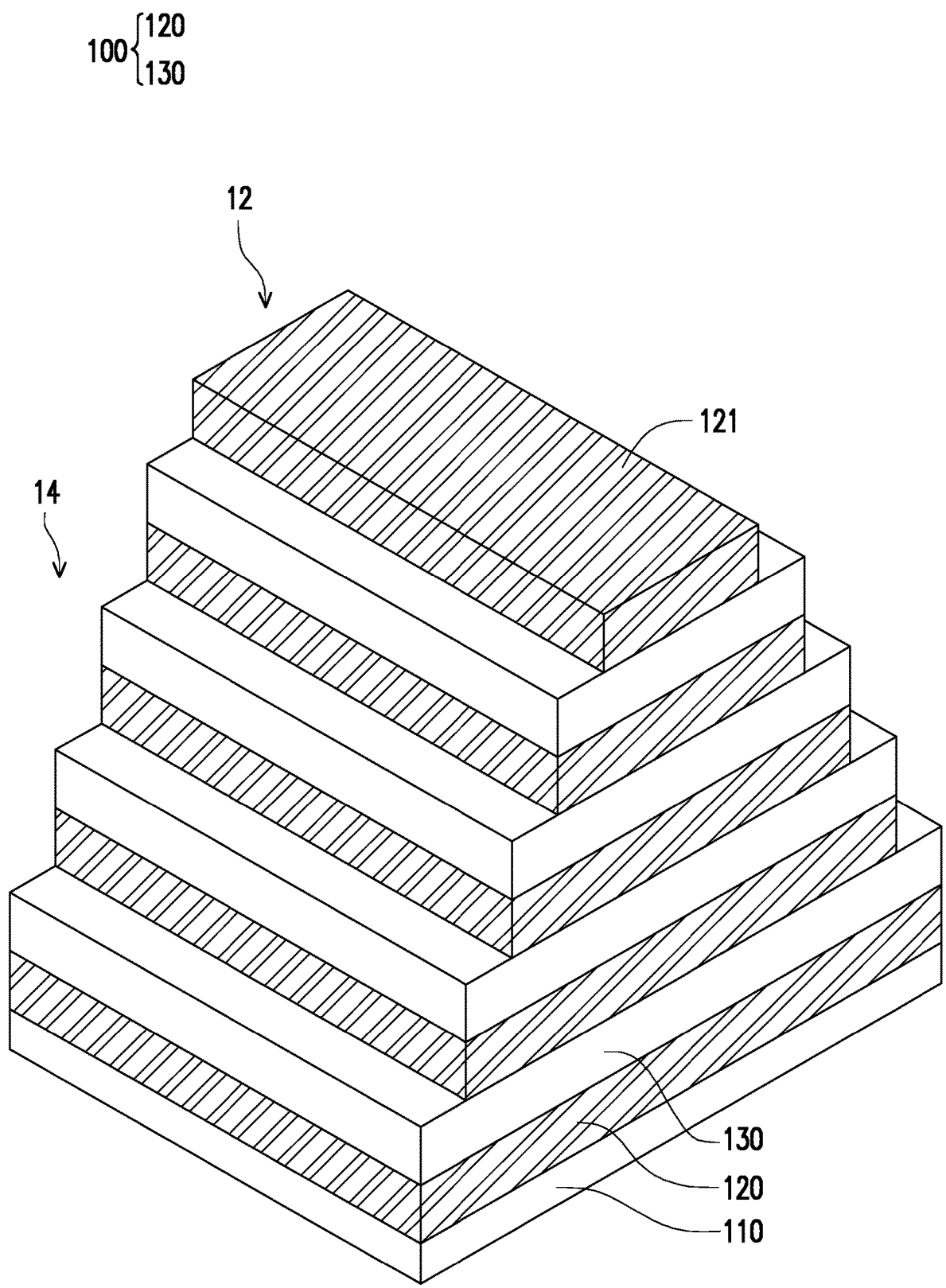
FIG. 3D is a schematic 3D view illustrating a stack of word line layers and insulating layers for a manufacturing step thereof in accordance with some embodiments of the disclosure.

FIG. 3C is a schematic 3D view illustrating a stack 100 of word line layers 120 and insulating layers 130 for a manufacturing step thereof in accordance with some embodiments of the disclosure. FIG. 3D is a schematic 3D view illustrating a stack 100 of word line layers 120 and insulating layers 130 for a manufacturing step thereof in accordance with some embodiments of the disclosure. Referring to FIG. 3C and FIG. 3D, after performing etching process illustrated in FIG. 3B, the photoresist mask 30 is reduced in its dimension by trimming a portion of the photoresist mask 30 through, for example, an isotropic etching process to expose another portion of the top surface 121 of the stack 100. Moreover, as illustrated in FIG. 3C and FIG. 3D, the anisotropic process can be repeatedly performed to remove the portions of the stack 100 exposed from the photoresist mask 30. As such, the staircase region 14 having a stair-step structure of the stack 100 can be formed through repetition of the above etching and trimming processes.

In some embodiments, the above etching and trimming processes can be further repeated to form the stack 100 having more steps than the illustrated in FIG. 3D. In some embodiments not illustrated, the dimension of each step in the staircase region 14 can be determined by adjusting the dimensions of the photoresist mask 30 in the trimming process of the stack 100. In some embodiments not illustrated, a desired number of steps to be formed in the stack 100 can be determined based on the numbers of the repetition of the above trimming processes of the photoresist mask 30 and the etching processes of the stack 100.

After the repetitive etching and the trimming processes of the photoresist mask 30 and the stack 100, the photoresist mask 30 is removed away from the top surface 121 of the stack 100 through, for example, a plasma ashing process or a wet stripping process.

Figure 4A:
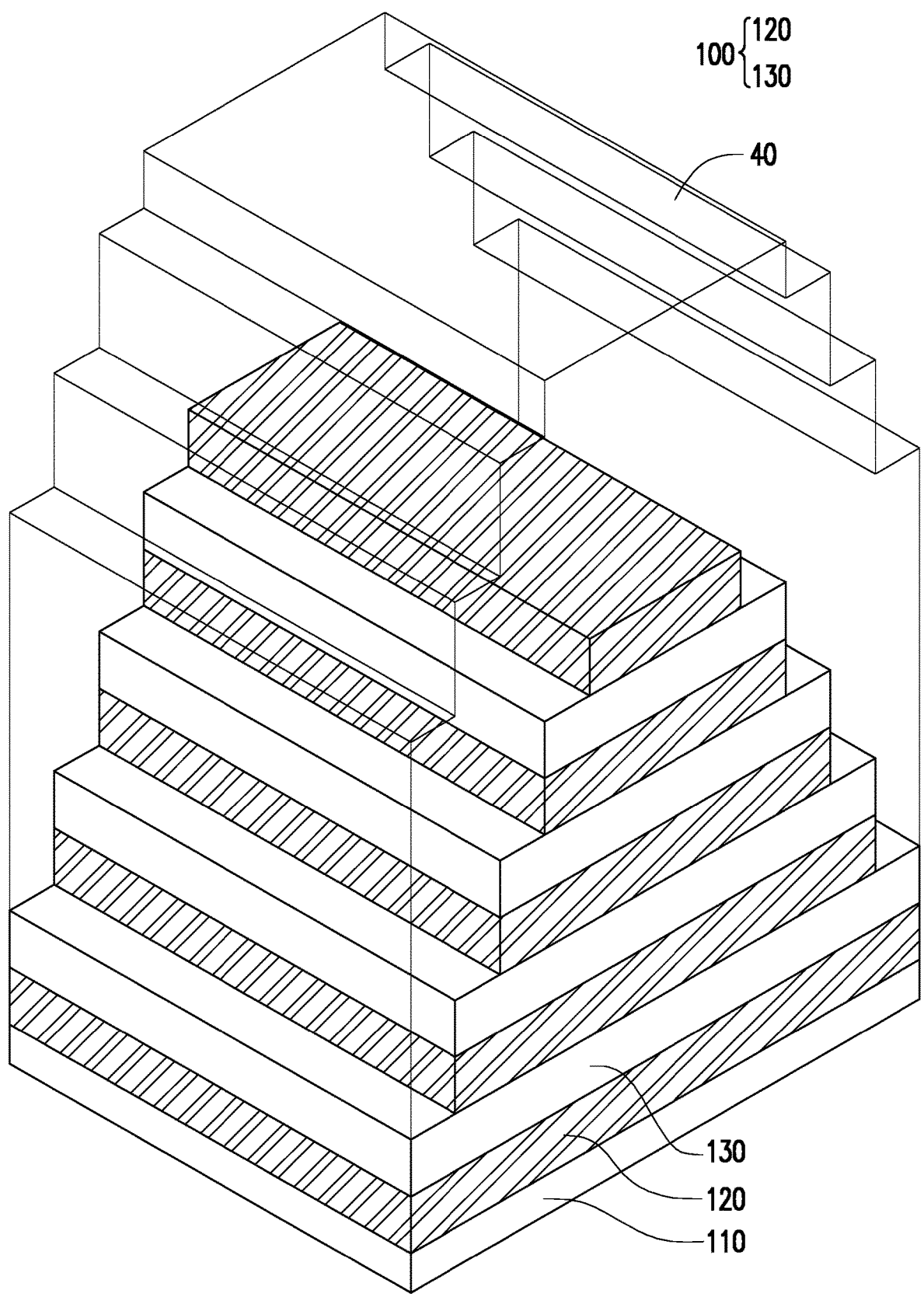
FIG. 4A is a schematic 3D view illustrating a memory device in accordance with some embodiments of the disclosure.

FIG. 4A is a schematic 3D view illustrating a stack 100 of word line layers 120 and insulating layers 130 for a manufacturing step thereof in accordance with some embodiments of the disclosure. Referring to FIG. 4A, after removing the photoresist mask 30 from the top surface 121 the stack 100, the staircase region 14 of the stack 100 and the top surface 121 of the stack 100 are both deposited with, for example, an inter-metal dielectric material 40. As illustrated, a portion of the inter-metal dielectric materials 40 formed above the staircase region 14 also has a stair-like shape.

Figure 4B:
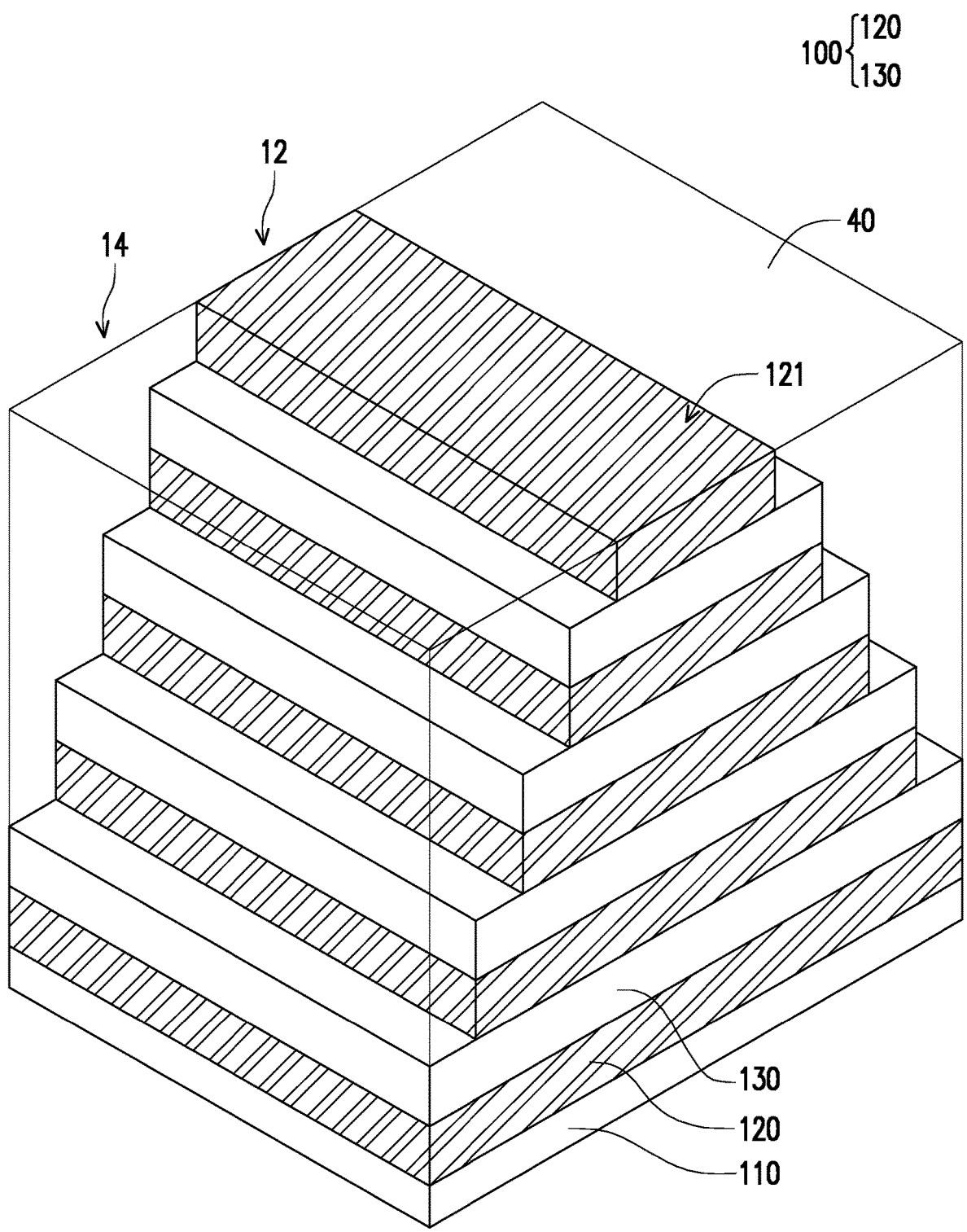
FIG. 4B is a schematic 3D view illustrating a stack of word line layers and insulating layers for a manufacturing step thereof in accordance with some embodiments of the disclosure.

FIG. 4B is a schematic 3D view illustrating a stack 100 of word line layers 120 and insulating layers 130 for a manufacturing step thereof in accordance with some embodiments of the disclosure. After depositing the inter-metal dielectric material 40, a chemical mechanical polishing (CMP) process can be applied to the inter-metal dielectric material 40 deposited on the stack 100 of the word line layers 120 and the insulating layers 130 to remove excess materials of the staircase region 14 and the topmost word line layer 120 in the stack 100. After the polishing and planarization processes, the cell array region 12 of the stack 100 is exposed from the inter-metal dielectric material 40 for the subsequent manufacturing processes.

Figure 5A:
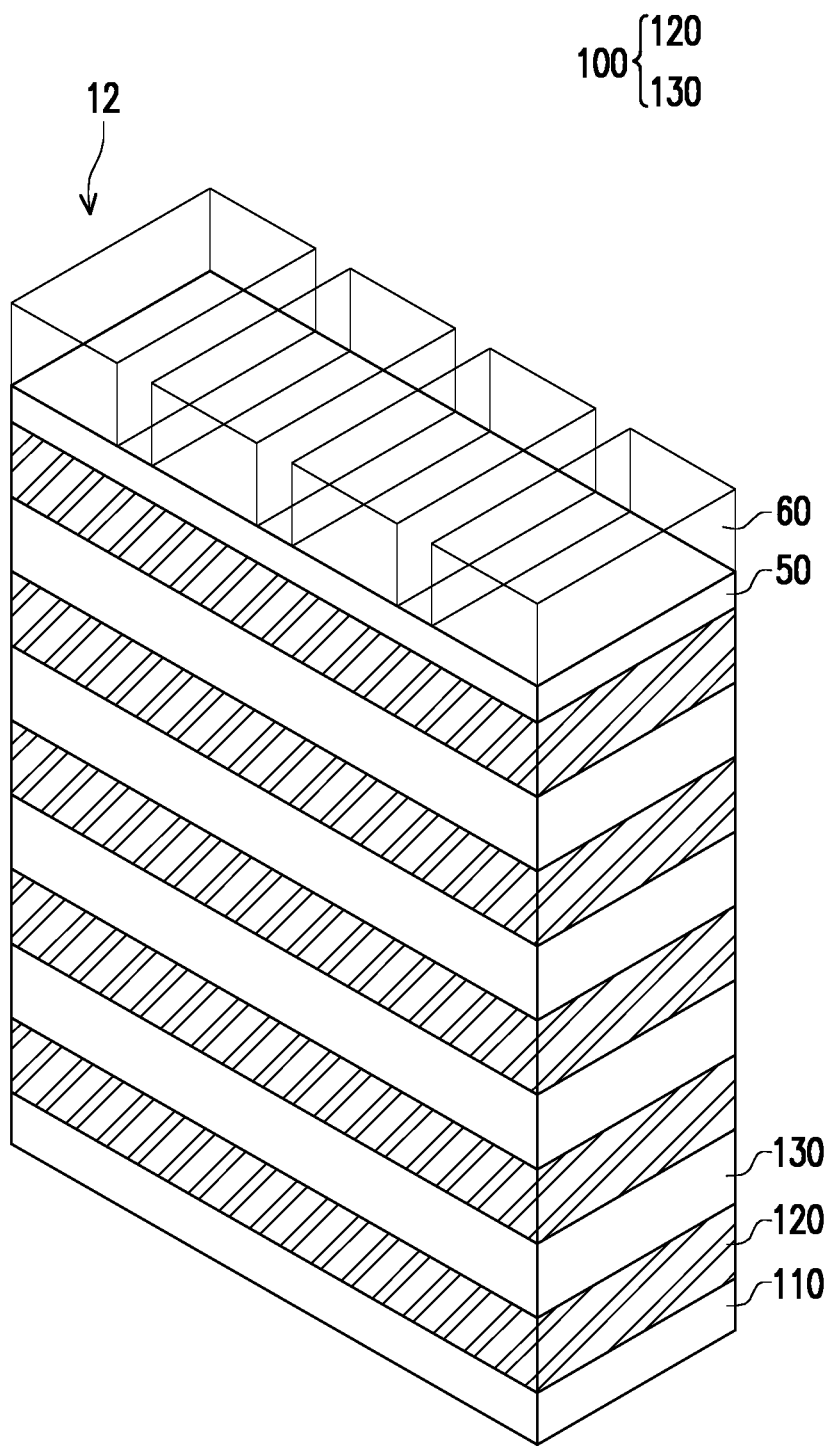
FIG. 5A is a schematic 3D view illustrating a cell array region of the stack for a manufacturing step thereof in accordance with some embodiments of the disclosure.

FIG. 5A is a schematic 3D view illustrating a cell array region 12 of the stack 100 for a manufacturing step thereof in accordance with some embodiments of the disclosure.

Referring to FIG. 5A, after the polishing and planarization processes as illustrated in FIG. 4B, a hard mask layer 50 and a photoresist film 60 are subsequently deposited on the topmost surface of the cell array region 12 in the stack 100 of the word line layers 120 and the insulating layers 130. In some embodiments, the photoresist film 60 is trimmed and patterned by, for example, a plasma etching process. The patterned photoresist film 60 can provide etching selectivity for transferring the pattern of the photoresist film 60 to the hard mask layer 50.

In some embodiments, the hard mask layer 50 can be formed by a polysilicon layer, a silicon oxide layer, a silicon nitride layer, or a silicon oxynitride layer. In some embodiments, a thickness of the hard mask layer 50 can be in a range from about 20 nm to about 200 nm, and a thickness of the photoresist film 60 is about 150 nm or less. In some embodiments, the hard mask layer 50 is deposited on the cell array region 12 by, for example, a plasma enhanced chemical vapor deposition (PECVD).

Figure 5B:
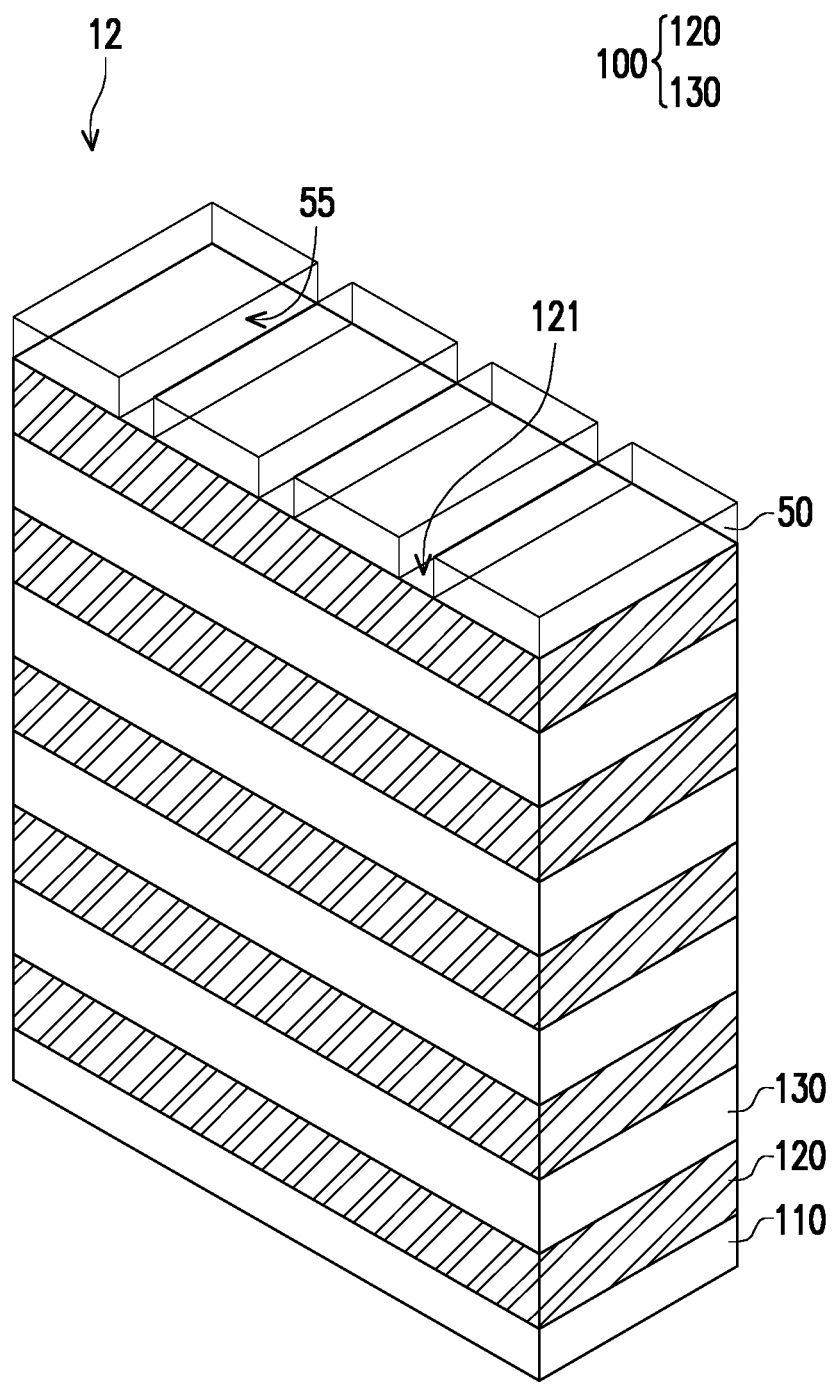
FIG. 5B is a schematic 3D view illustrating a cell array region of the stack for a manufacturing step thereof in accordance with some embodiments of the disclosure.

FIG. 5B is a schematic 3D view illustrating a cell array region 12 of the stack 100 for a manufacturing step thereof in accordance with some embodiments of the disclosure. After subsequently depositing the hard mask layer 50, the photoresist film 60, and further patterning the photoresist film 60 by trimming, a photolithographic etching process is applied to the patterned photoresist film 60 and the hard mask layer 50 to transfer the pattern of the photoresist film 60 to the hard mask layer 50 and to form patterned trenches 55 in the hard mask layer 50. As illustrated in FIG. 5B, after the wet etching process, a portion of the top surface 121 of the stack 100 is exposed from the patterned trenches 55 of the hard mask layer 50.

Figure 5C:
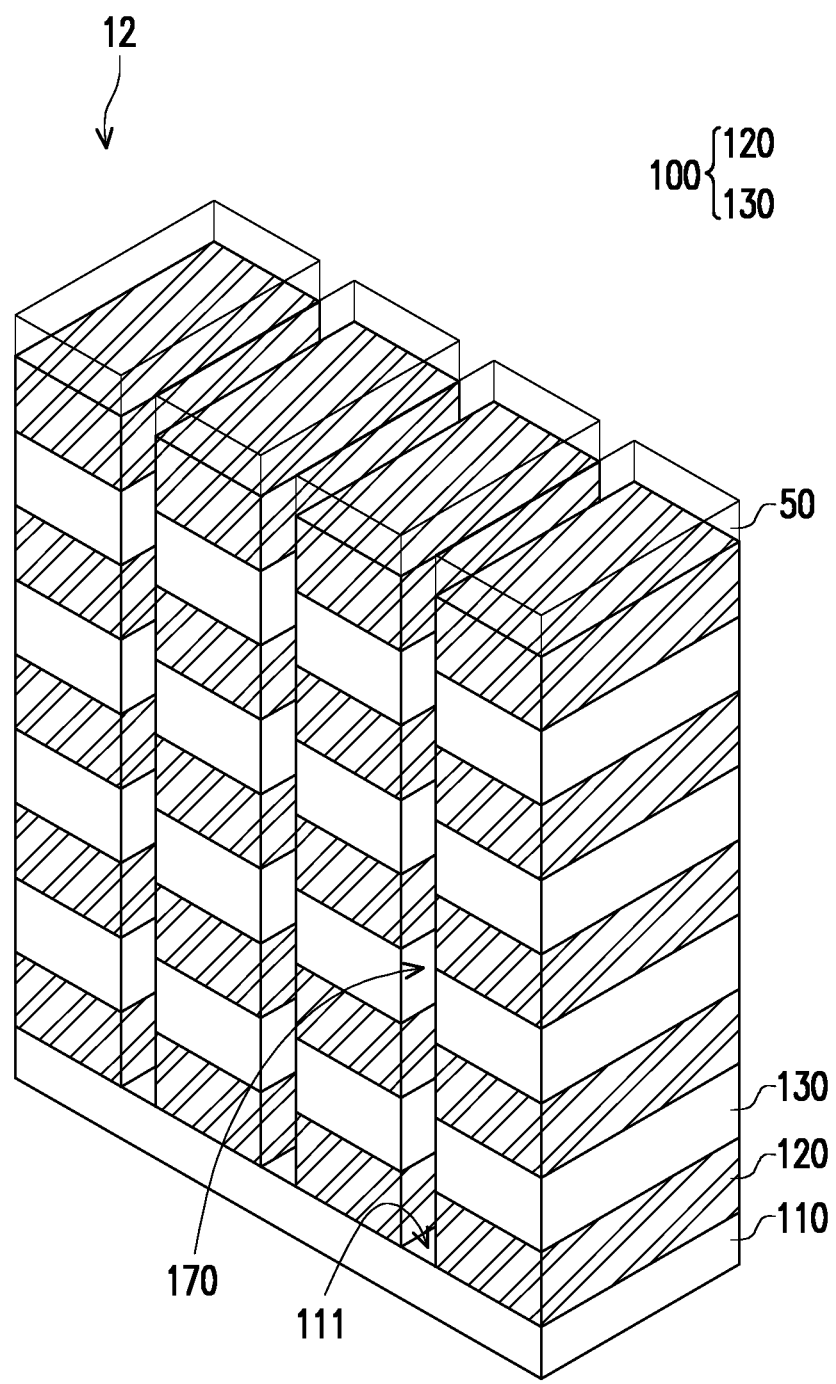
FIG. 5C is a schematic 3D view illustrating a cell array region of the stack for a manufacturing step thereof in accordance with some embodiments of the disclosure.

FIG. 5C is a schematic 3D view illustrating a cell array region 12 of the stack 100 for a manufacturing step thereof in accordance with some embodiments of the disclosure. Referring to FIG. 5C, after patterning and forming the patterned trenches 55 in the hard mask layer 50, the photoresist film 60 can be stripped by, for example, a plasma etching process or a wet stripping process. In the present embodiment, a photolithography process can be applied along the patterned trenches 55 to etch the cell array region 12 of the stack 100 vertically to the substrate 110, so as to form a plurality of the isolation trenches 170. As illustrated in FIG. 5C, the isolation trenches 170 are extended vertically from the topmost surface 121 of the stack 100 to the major surface 111 of the substrate 110.

Figure 5D:
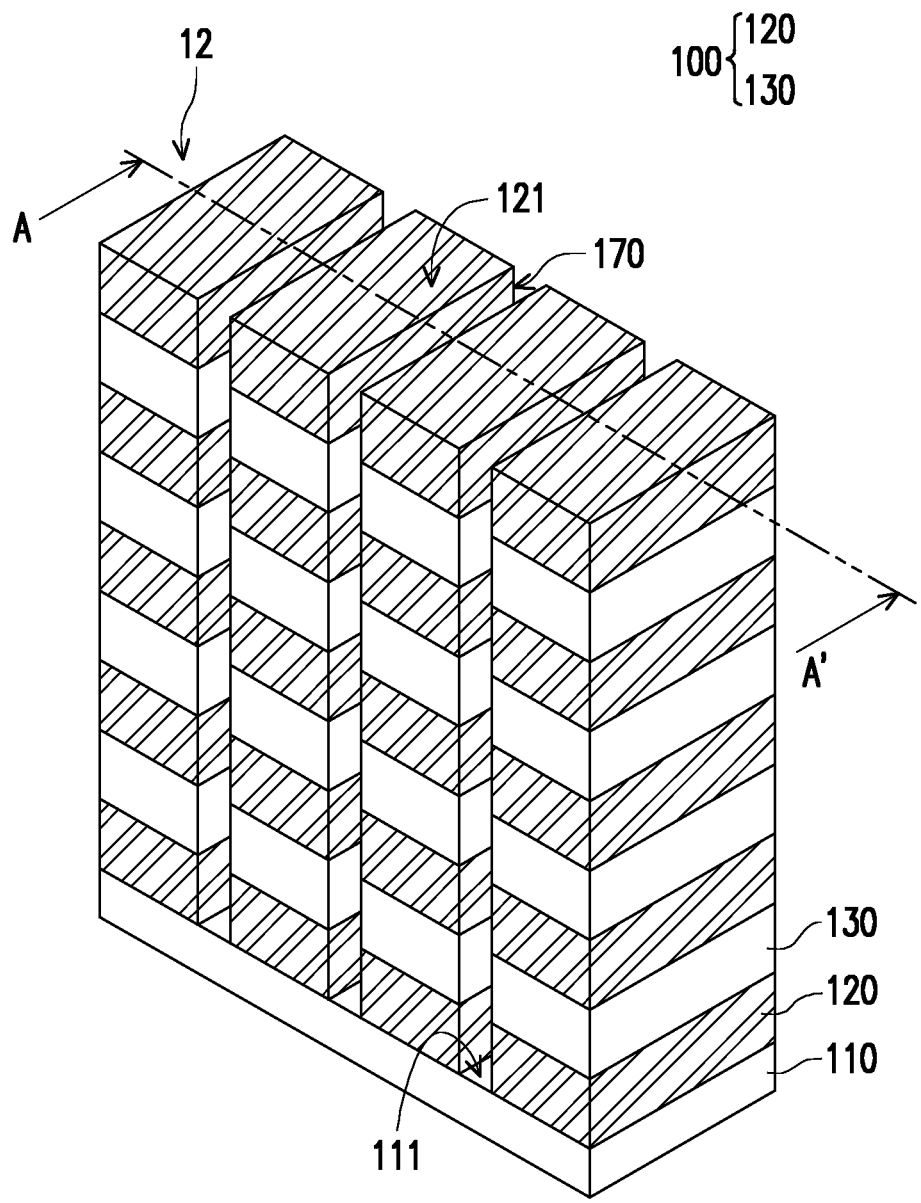
FIG. 5D is a schematic 3D view illustrating a cell array region of the stack for a manufacturing step thereof in accordance with some embodiments of the disclosure.

FIG. 5D is a schematic three-dimensional 3D view illustrating a cell array region 12 of the stack 100 for a manufacturing step thereof in accordance with some embodiments of the disclosure. Referring to FIG. 5D, after forming the isolation trenches 170 in the stack 100, the hard mask layer 50 can be removed from the cell array region 12 of the stack 100 by, for example, a wet etching process to expose the top surface 121 of the cell array region 12.

Figure 5E:
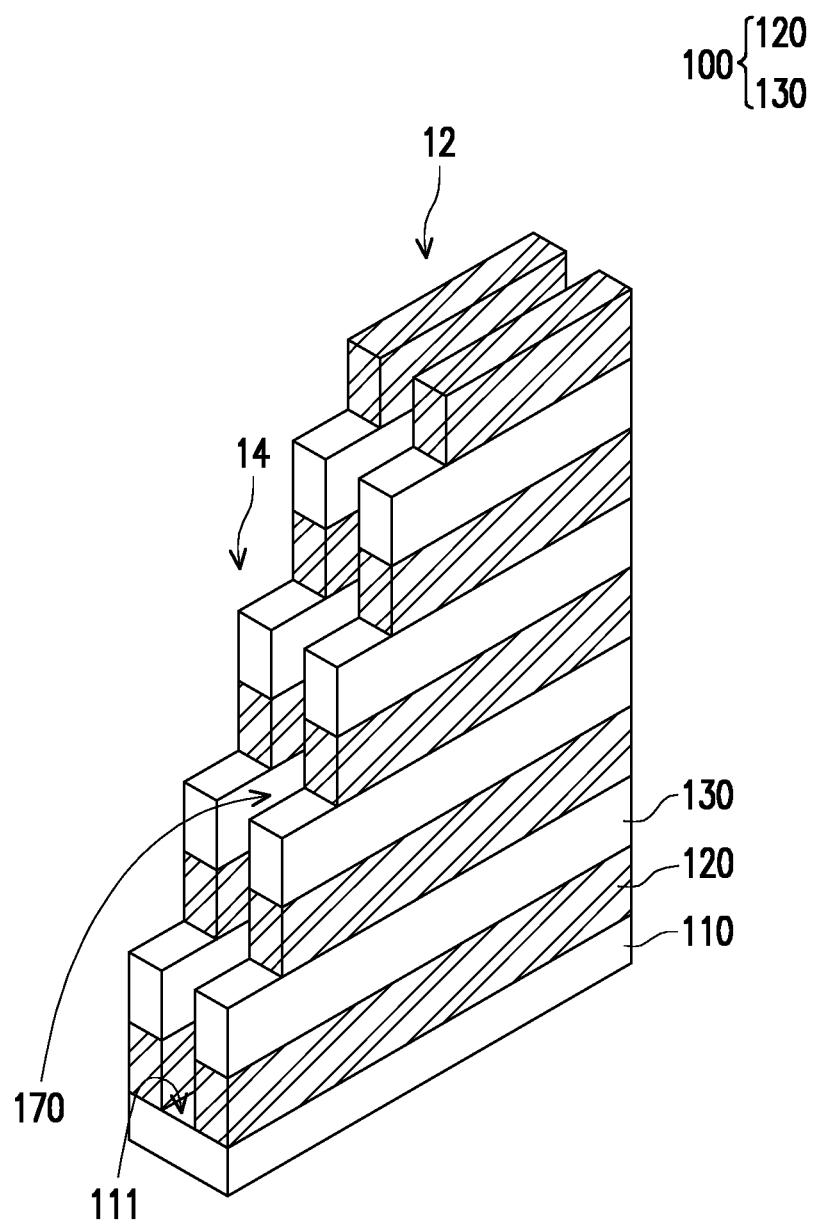
FIG. 5E is a schematic 3D view illustrating a staircase region of the stack for a manufacturing step thereof in accordance with some embodiments of the disclosure.

FIG. 5E is a schematic 3D view illustrating a staircase region 14 of the stack 100 for a manufacturing step thereof in accordance with some embodiments of the disclosure. Referring to FIG. 5E, the above etching process for forming the isolation trenches 170 in the cell array region 12 is also applied to the staircase region 14. As illustrated in FIG. 5E, the cell array region 12 and the staircase region 14 are both vertically etched to form the isolation trenches 170 extended therebetween.

Figure 6A:
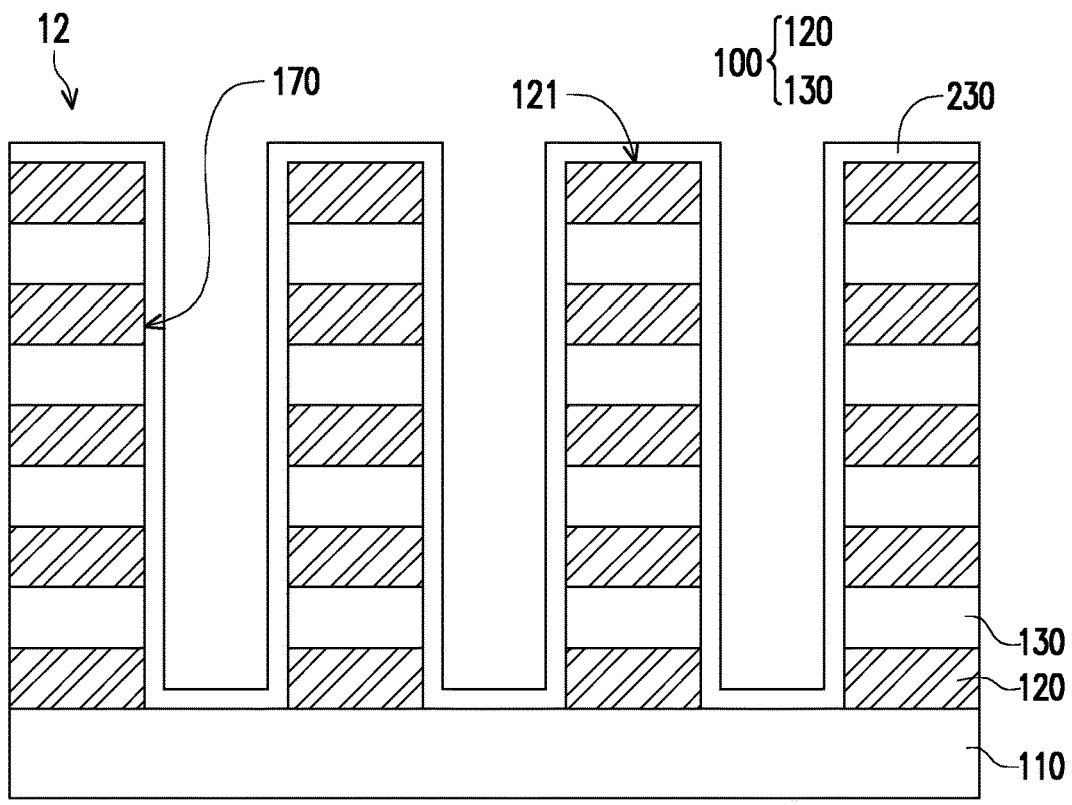
FIG. 6A is a schematic cross-sectional view along an AA' line of FIG. 5D illustrating a cell array region for a manufacturing step thereof in accordance with some embodiments of the disclosure.

FIG. 6A is a schematic cross-sectional view along an AA' line of FIG. 5D illustrating a cell array region 12 for a manufacturing step thereof in accordance with some embodiments of the disclosure. Referring to FIG. 6A, in some embodiments, after forming isolation trenches 170 in the stack 100 of the alternating word line layers 120 and insulating layers 130, a high-k dielectric layer 230, such as HfZrO (HZO) layer, is deposited to cover the side walls of the isolation trenches 170 and the top surface 121 of the stack 100. After the deposition, the high-k dielectric layer 230 is annealed through a laser thermal annealing method or a rapid thermal annealing (RTA) method. In some embodiments, the high-k dielectric layer 230 formed by HZO layer may be replaced with silicon nitride ($SiO_x/SiN_x/SiO_x$ (ONO)) layer, ferroelectric layer, and/or other memory layers.

Figure 6B:
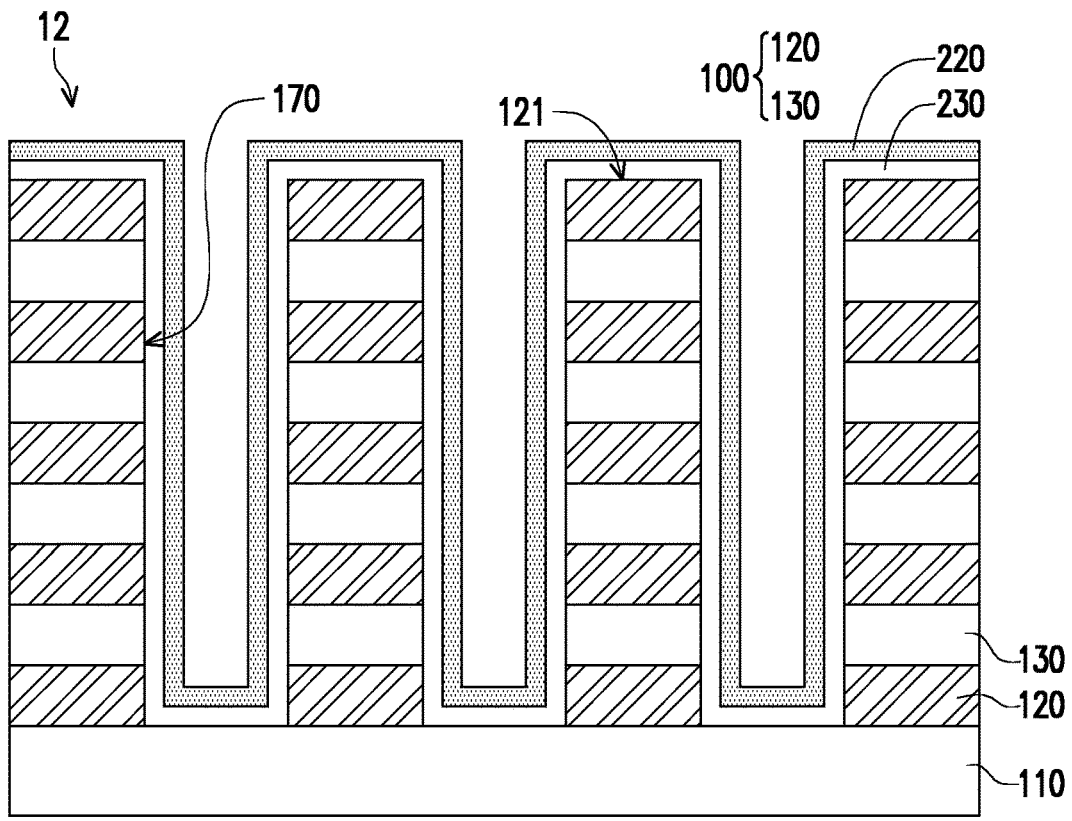
FIG. 6B is a schematic cross-sectional view along an AA' line of FIG. 5D illustrating a cell array region for a manufacturing step thereof in accordance with some embodiments of the disclosure.
Figure 6C:
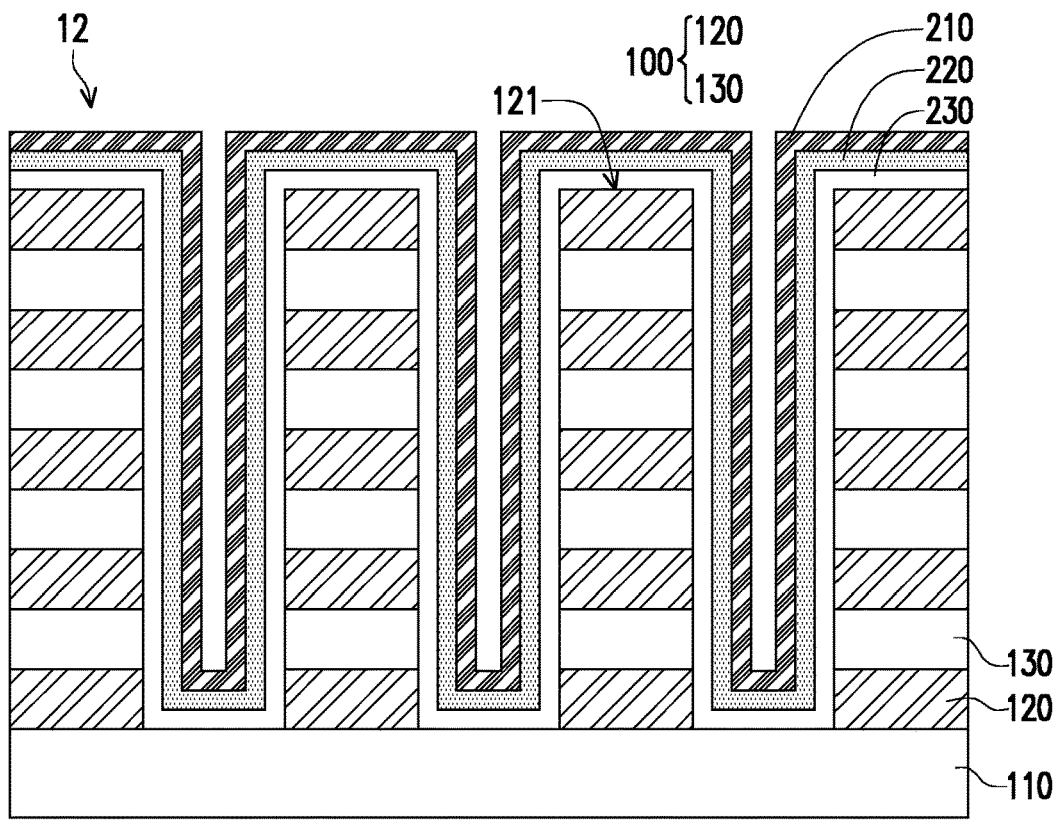
FIG. 6C is a schematic cross-sectional view along an AA' line of FIG. 5D illustrating a cell array region for a manufacturing step thereof in accordance with some embodiments of the disclosure.

FIG. 6B is a schematic cross-sectional view along an AA' line of FIG. 5D illustrating a cell array region 12 for a manufacturing step thereof in accordance with some embodiments of the disclosure. FIG. 6C is a schematic cross-sectional view along an AA' line of FIG. 5D illustrating a cell array region 12 for a manufacturing step thereof in accordance with some embodiments of the disclosure. Subsequently, a dual layer oxide semiconductor structure including the first oxide semiconductor layer 210 and the second oxide semiconductor layer 220 are respectively formed above the high-k dielectric layer 230. Specifically, referring to FIG. 6B, the second oxide semiconductor layer 220 is deposited on the high-k dielectric layer 230. Referring to FIG. 6C, after forming the second oxide semiconductor layer 220, the first oxide semiconductor layer 210 is deposited on the second oxide semiconductor layer 220. As illustrated in FIG. 6B, after the above deposition processes, the second oxide semiconductor layer 220 is disposed within the isolation trenches 170 and covers the top surface 121 of the stack 100. In some embodiments, the second oxide semiconductor layer 220 can be formed by an oxide material $In_xGa_yZn_zMO$, wherein M can be Ti, Al, Ag, Si, Sn, and x, y, z are the numbers respectively less than 1 and larger than 0. In some other embodiments, the second oxide semiconductor layer 220 can be formed by at least one of the metal-oxide based semiconductor materials including IGZO, IZO, ITO, AZO, GZO, or a mixture thereof.

As illustrated in FIG. 6C, the second oxide semiconductor layer 220 is disposed within the isolation trenches 170 and overlayed the top surface 121 of the stack 100. In some embodiments, the first oxide semiconductor layer 210 can be formed by the oxide material contains Ga, or Zn, for example, $Ga_yZn_zMO$, wherein M can be Si, Mg, Ti, Ca. In some embodiments, the oxidation process of the first oxide semiconductor layer 220 is through a gas soak process or a plasma treatment by nitrous oxide ($N_2O$), carbon dioxide ($CO_2$), oxygen ($O_2$), ozone ($O_3$), water ($H_2O$), etc.

In the present embodiment, the dual layer oxide semiconductor structure including the first oxide semiconductor layer 210 and the second oxide semiconductor layer 220 are annealed together after the deposition through, for example, a laser thermal annealing method or an RTA method to remove moisture and reduce the concentration of impurities therein.

Figure 6D:
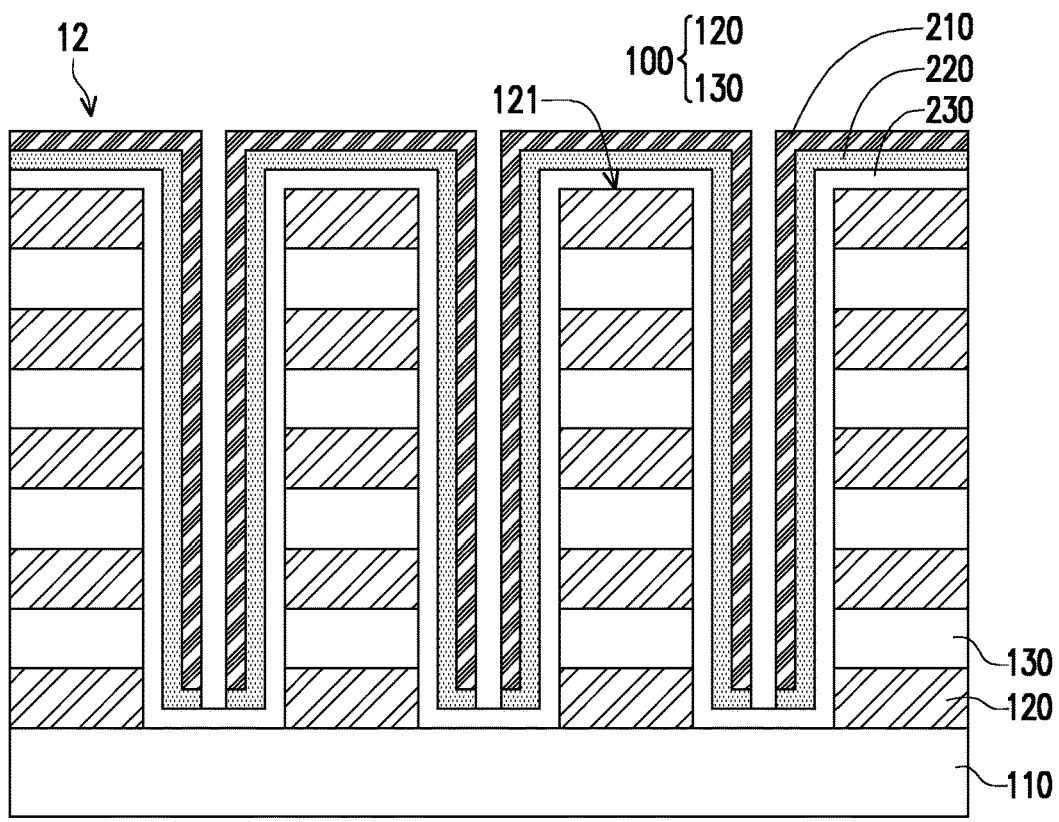
FIG. 6D is a schematic cross-sectional view along an AA' line of FIG. 5D illustrating a cell array region for a manufacturing step thereof in accordance with some embodiments of the disclosure.

FIG. 6D is a schematic cross-sectional view along an AA' line of FIG. 5D illustrating a cell array region 12 for a manufacturing step thereof in accordance with some embodiments of the disclosure. In some embodiments, referring to FIG. 6D, after the steps of filling the high-k dielectric layer 230, the first oxide semiconductor layer 210, and the second oxide semiconductor layer 220 into the isolation trenches 170 to cover the side walls and the bottoms thereof, a portion of the first oxide semiconductor layer 210 and the second oxide semiconductor layer 220 disposed above the bottoms of the isolation trenches 170 and a portion of the high-k dielectric layer 230 disposed underneath are further etched and removed to expose the portion of the high-k dielectric layer 230 covering the bottoms of the isolation trenches 170.

Figure 6E:
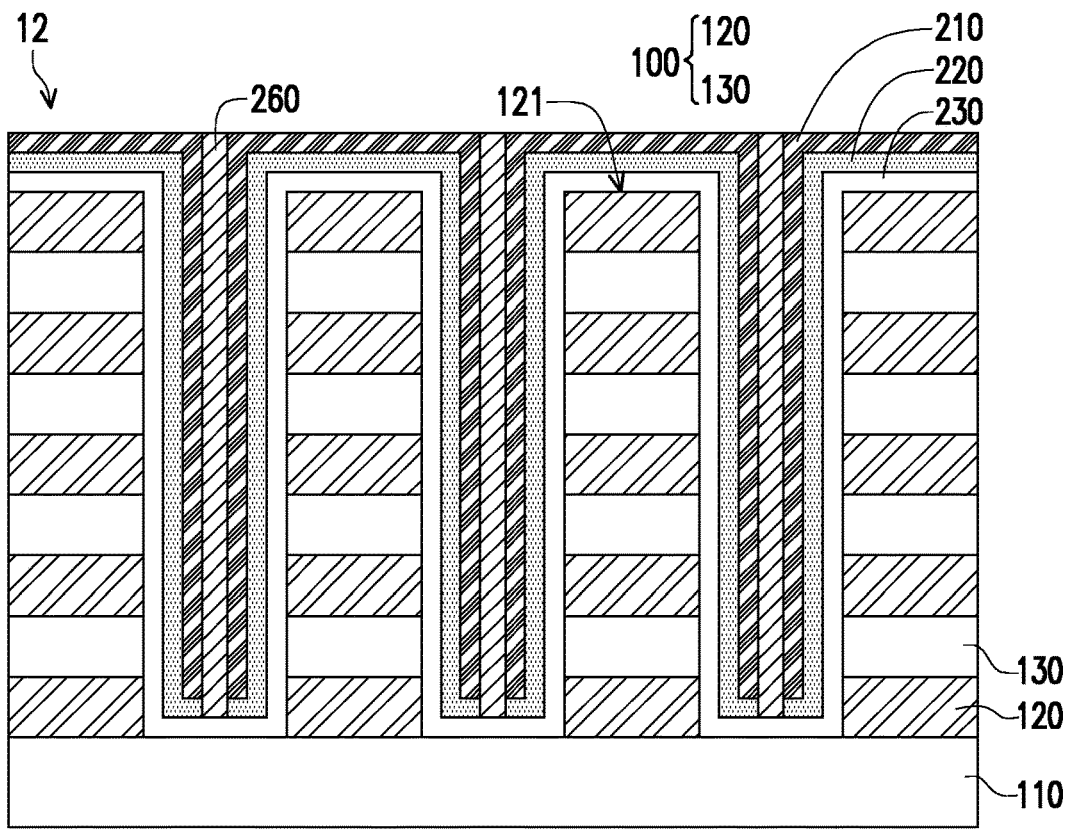
FIG. 6E is a schematic cross-sectional view along an AA' line of FIG. 5D illustrating a cell array region for a manufacturing step thereof in accordance with some embodiments of the disclosure.

FIG. 6E is a schematic cross-sectional view along an AA' line of FIG. 5D illustrating a cell array region 12 of for a manufacturing step thereof in accordance with some embodiments of the disclosure. Referring to FIG. 6E, after etching the portion of the first oxide semiconductor layer 210 and the second oxide semiconductor layer 220 to expose the portion of the high-k dielectric layer 230 covering the bottoms of the isolation trenches 170, a side wall oxide layer 260, for example, a $SiO_x$ layer can be filled into gaps formed within the isolation trenches 170 and among the high-k dielectric layer 230, the first oxide semiconductor layer 210, and the second oxide semiconductor layer 220.

Figure 6F:
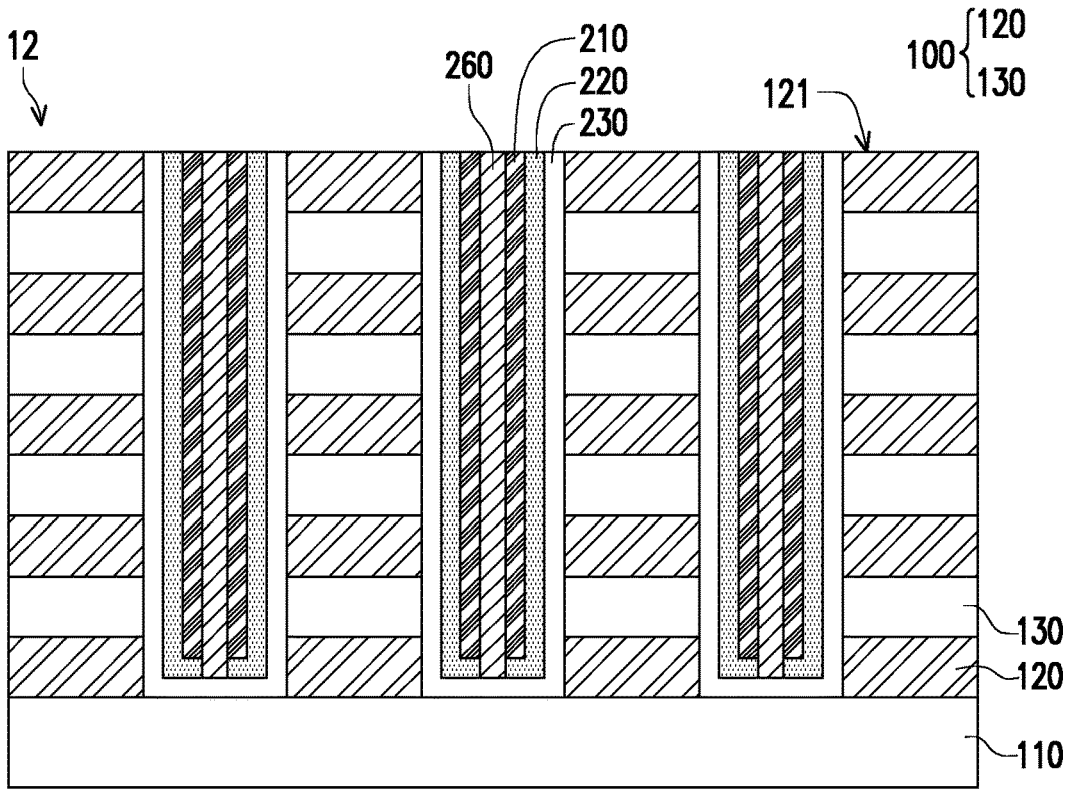
FIG. 6F is a schematic cross-sectional view along an AA' line of FIG. 5D illustrating a cell array region for a manufacturing step thereof in accordance with some embodiments of the disclosure.

FIG. 6F is a schematic cross-sectional view along an AA' line of FIG. 5D illustrating a cell array region 12 for a manufacturing step thereof in accordance with some embodiments of the disclosure. Referring to FIG. 6F, after filling the side wall oxide layer 260 into the isolation trenches, a planarization process, for example a CMP process, can be subsequently performed to remove excess materials of the high-k dielectric layer 230, the first oxide semiconductor layer 210, the second oxide semiconductor layer 220, and the side wall oxide layer 260 overlaying the top surface 121 of the stack 100.

Figure 7:
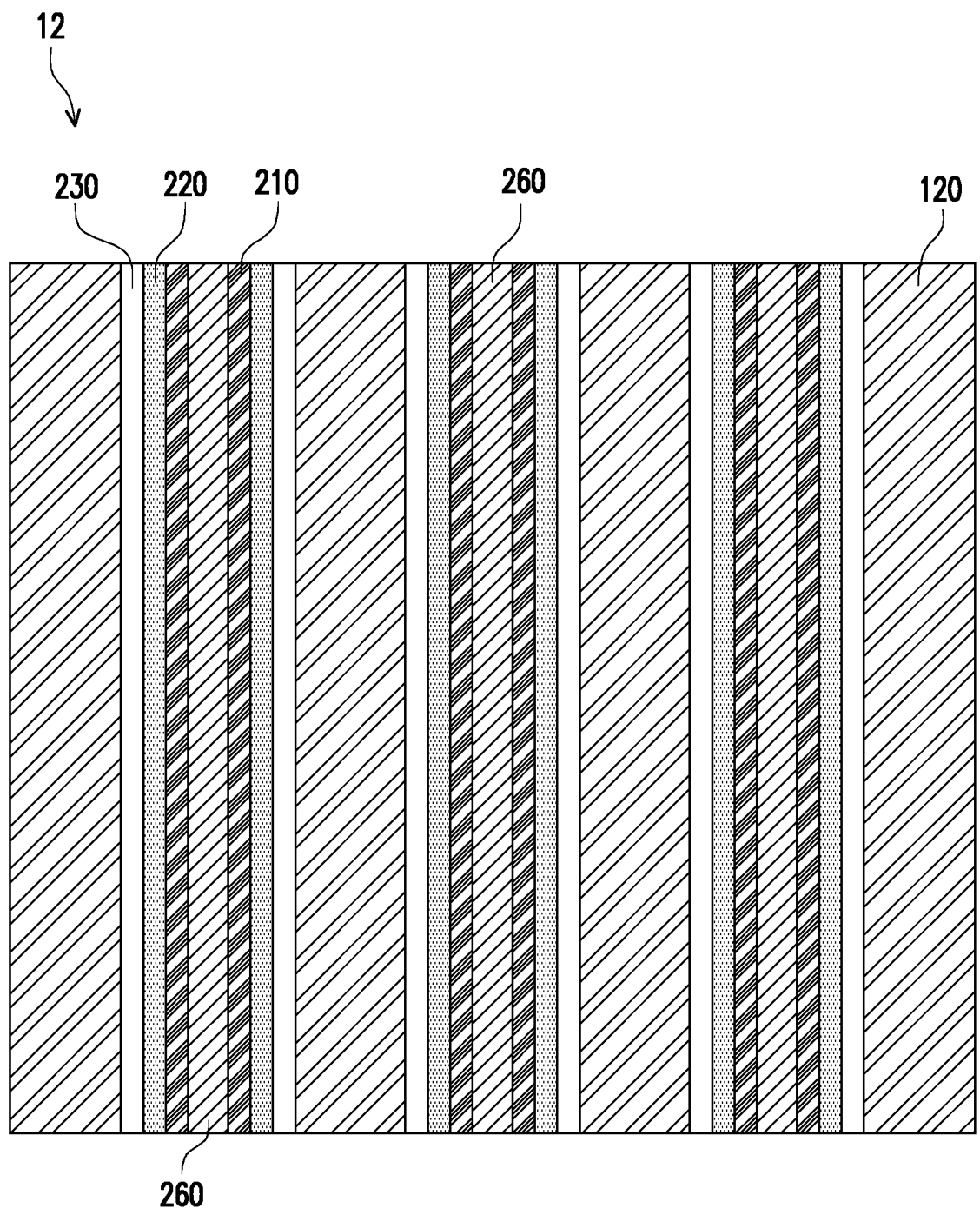
FIG. 7 is a schematic top view of FIG. 6F illustrating a cell array region of a stack of word line layers and insulating layers for a manufacturing step thereof in accordance with some embodiments of the disclosure.

FIG. 7 is a schematic top view of FIG. 6F illustrating a cell array region 12 of the stack 100 for a manufacturing step thereof in accordance with some embodiments of the disclosure. As illustrated in FIG. 6F and FIG. 7, from a top view of the cell array region 12 shown in FIG. 6F, the side wall oxide layer 260 filled in each of the isolation trenches 170 separates and isolates the first oxide semiconductor layers 210 and the second oxide semiconductor layers 220 disposed on the side walls of the isolation trenches 170, which are oppositely disposed and facing each other.

Figure 8A:
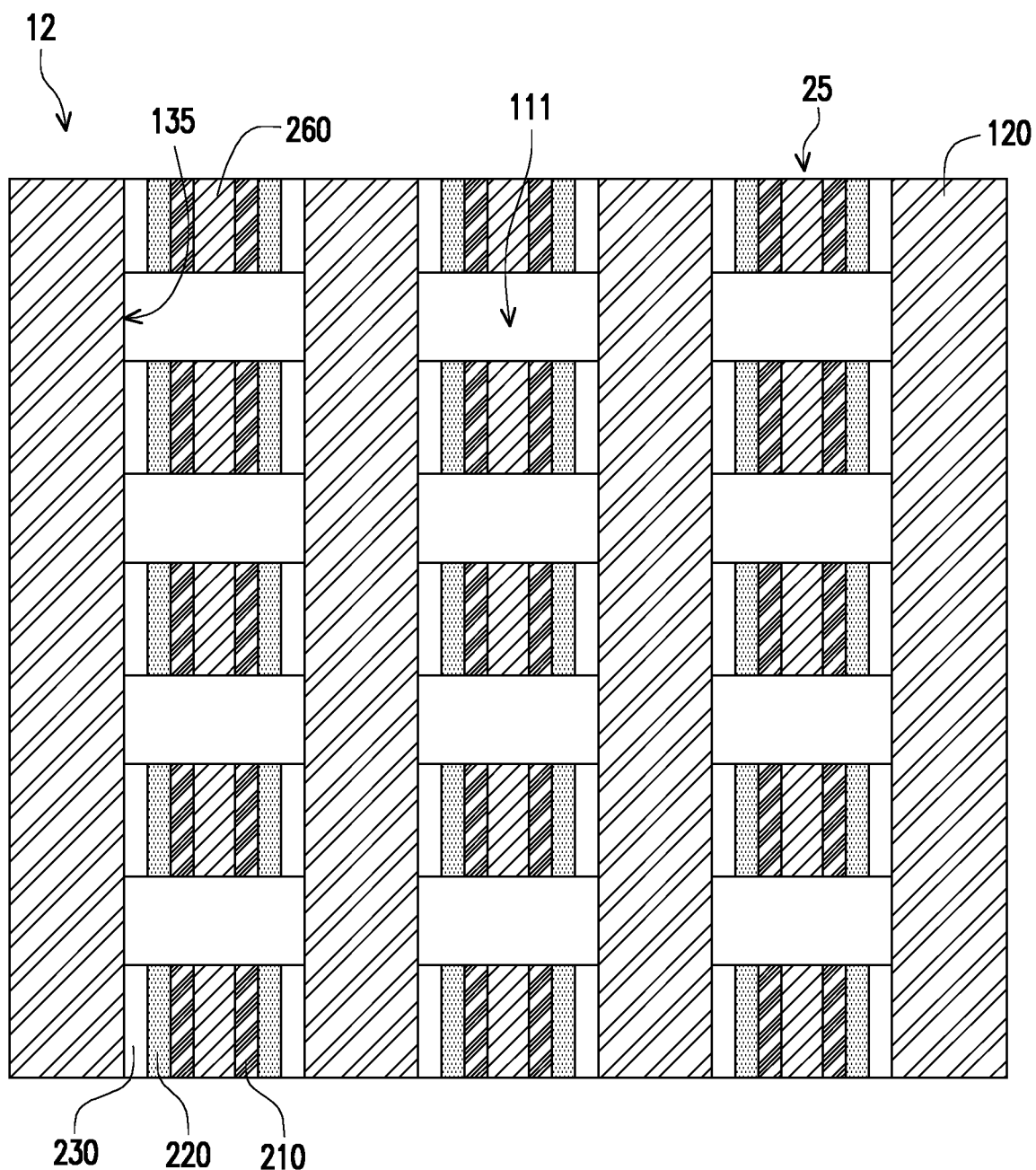
FIG. 8A is a schematic top view of the cell array region of a stack of word line layers and insulating layers for a manufacturing step thereof in accordance with some embodiments of the disclosure.

FIG. 8A is a schematic top view of the cell array region 12 of the stack 100 for a manufacturing step thereof in accordance with some embodiments of the disclosure. Referring to FIG. 8A, the high-k dielectric layer 230, the first oxide semiconductor layer 210, the second oxide semiconductor layer 220, and the side wall oxide layer 260 are etched to form gap holes 135 extended from the top surface 121 of the stack 100 to the major surface 111 of the substrate 110. As illustrated in FIG. 8A, the gap holes 135 respectively separate the high-k dielectric layer 230, the first oxide semiconductor structure 210, the second oxide semiconductor layer 220, and the side wall oxide layer 260 located in the isolation trenches 170 into a plurality of cell regions 25 for forming the memory cells 200 shown in FIG. 1 and FIG. 2.

Figure 8B:
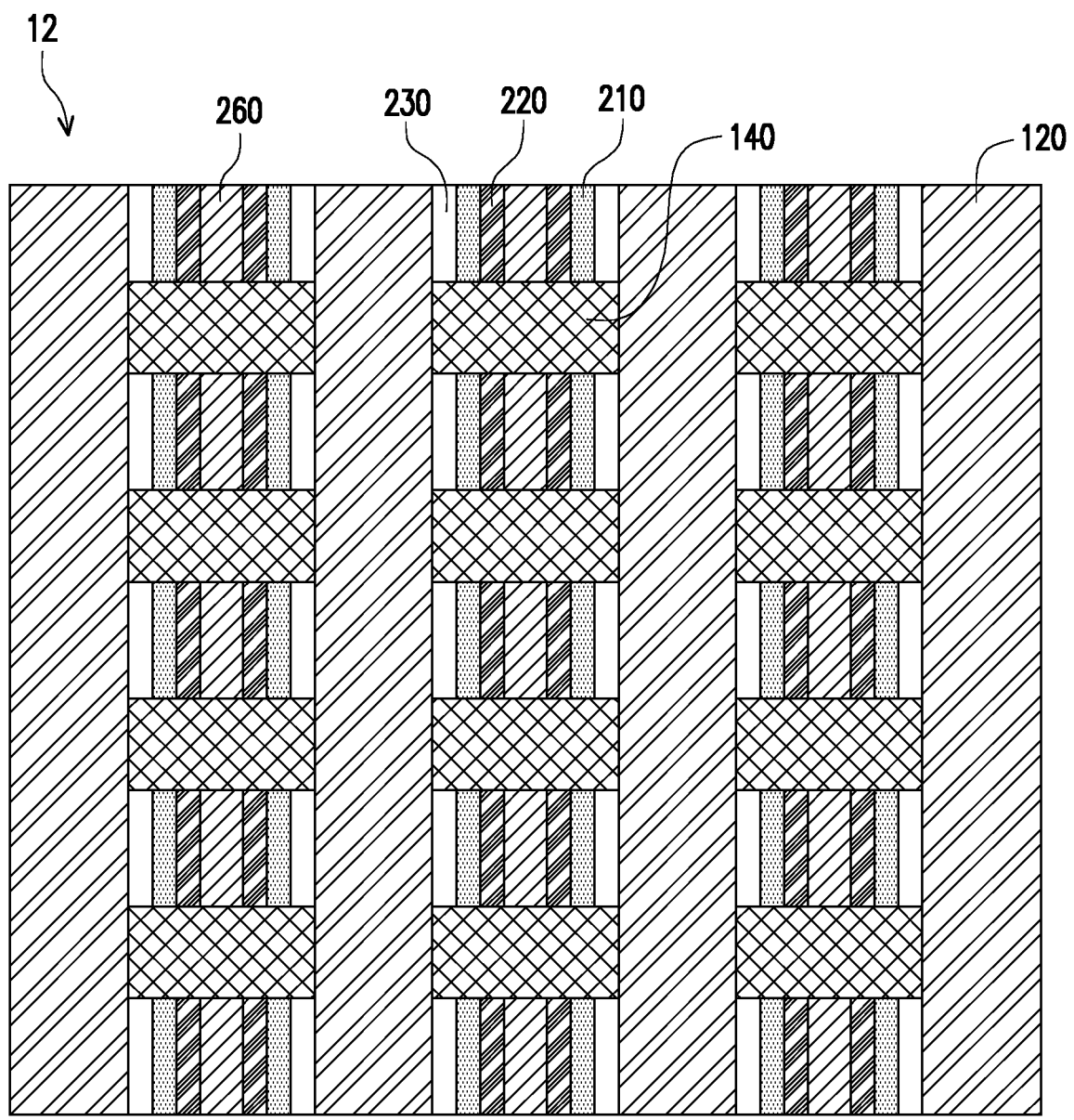
FIG. 8B is a schematic top view of the cell array region of a stack of word line layers and insulating layers for a manufacturing step thereof in accordance with some embodiments of the disclosure.

FIG. 8B is a schematic top view of the cell array region 12 of the stack 100 for a manufacturing step thereof in accordance with some embodiments of the disclosure. Referring to FIG. 8B, the gap holes 135 are filled with the insulating oxide material 140 to insulate the adjacent cell regions 25 shown in FIG. 8A. In some embodiments, after filling the insulating oxide material 140 into the gap holes 135, the CMP process can be applied to remove excess materials of the filled insulating oxide material 140 and the cell array region 12.

Figure 8C:
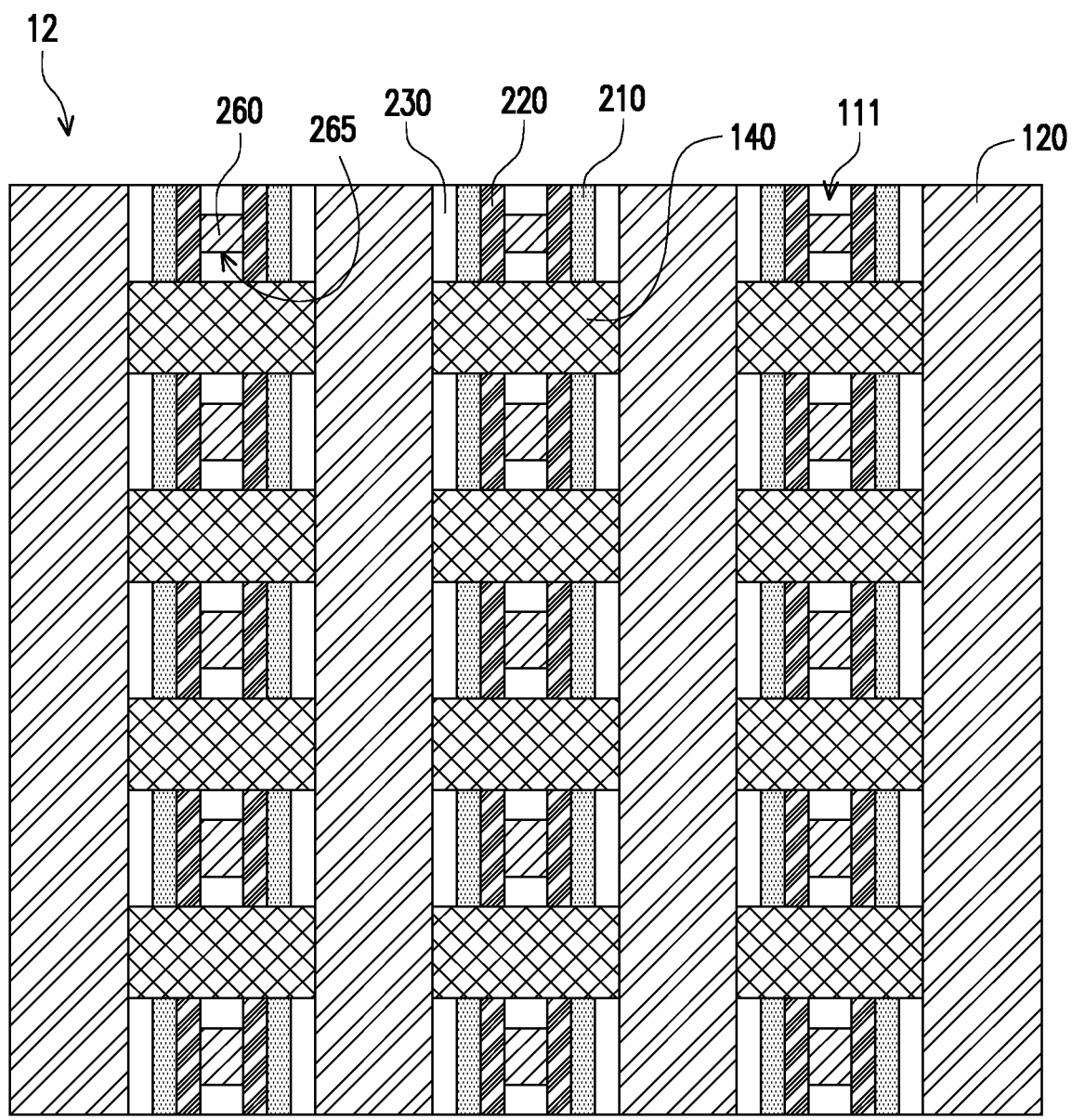
FIG. 8C is a schematic top view of the cell array region of a stack of word line layers and insulating layers for a manufacturing step thereof in accordance with some embodiments of the disclosure.

FIG. 8C is a schematic top view of the cell array region 12 of the stack 100 for a manufacturing step thereof in accordance with some embodiments of the disclosure. Referring to FIG. 8C, the side wall oxide layer 260, the first oxide semiconductor layer 210, and the second oxide semiconductor layer 220 in the each of the cell regions 25 shown in FIG. 8A are respectively etched to form vertical through holes 265, extended from the top surface of the cell array region 12 to the major surface 111 of the substrate 110, at opposite sides of the side wall oxide layer 260 in the each of the cell regions 25.

Figure 8D:
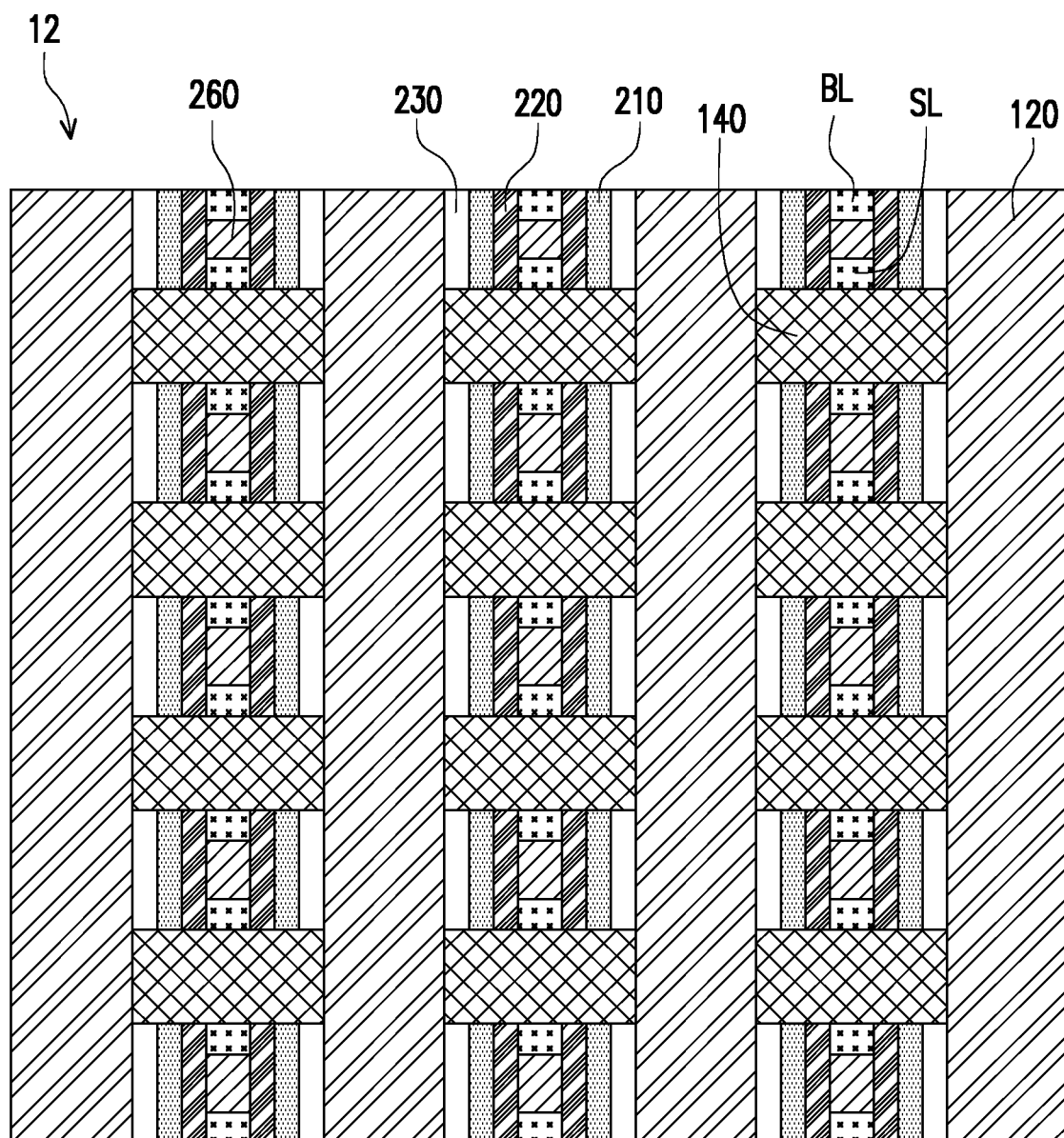
FIG. 8D is a schematic top view of the cell array region of a stack of word line layers and insulating layers for a manufacturing step thereof in accordance with some embodiments of the disclosure.

FIG. 8D is a schematic top view of the cell array region 12 of the stack 100 for a manufacturing step thereof in accordance with some embodiments of the disclosure. Referring to FIG. 8D, after performing etching process in each of the cell regions 25 to form the vertical through holes 265, the vertical through holes 265 are respectively filled with the conductive materials to form the source line electrodes SL and the bit line electrodes BL extended from the top surface cell array region 12 to the major surface 111 of the substrate 110.

Figure 9:
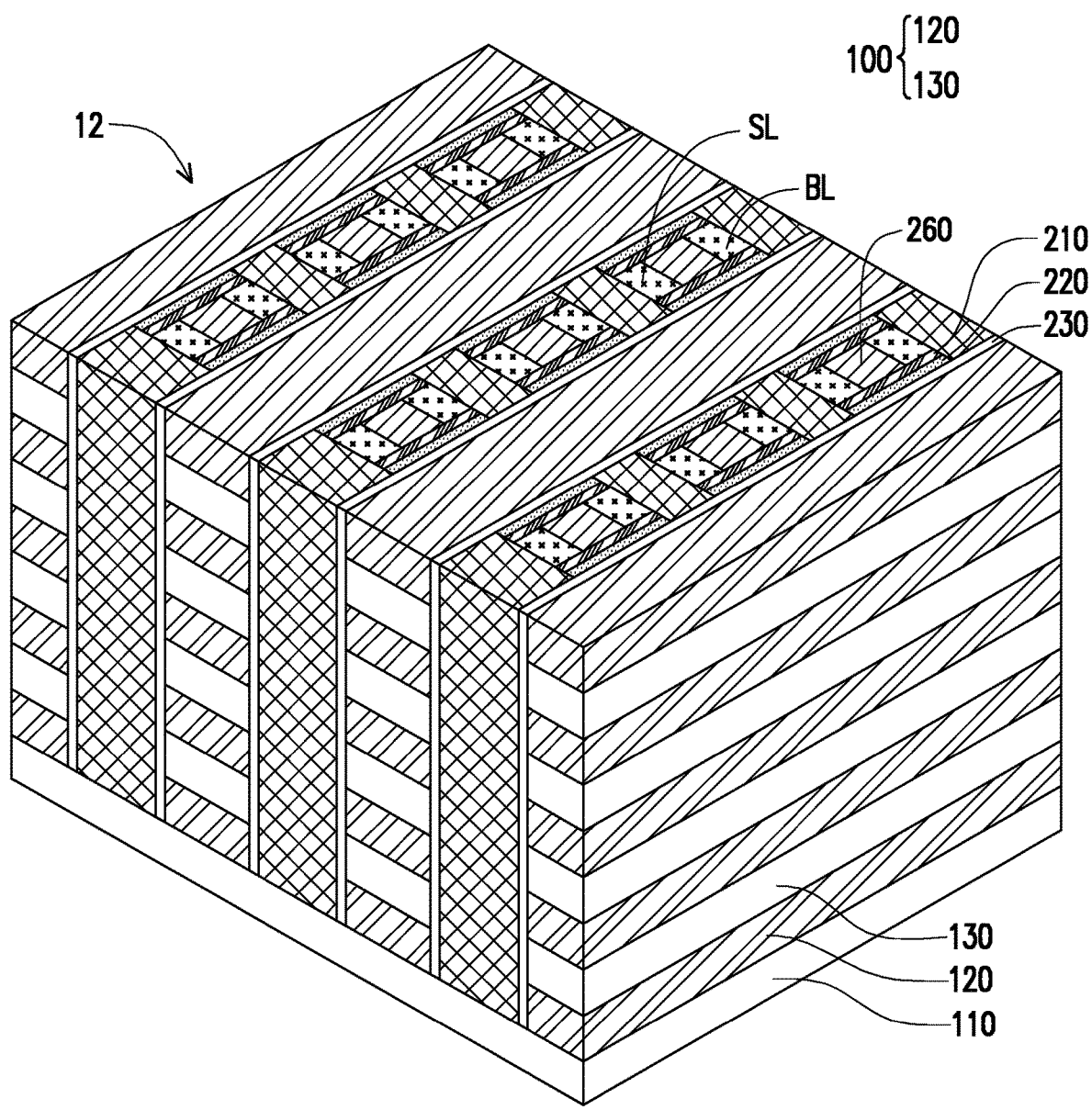
FIG. 9 is a schematic 3D view illustrating a cell array region of a memory device 10 in FIG. 1 in accordance with some embodiments of the disclosure.

FIG. 9 is a schematic perspective view illustrating a cell array region 12 of a memory device 10 in FIG. 1 in accordance with some embodiments of the disclosure. Referring to FIG. 9, after finishing the manufacturing step shown in FIG. 8D, the manufacturing process of the cell array region 12 of the memory device 10 is completed.

Figure 10:
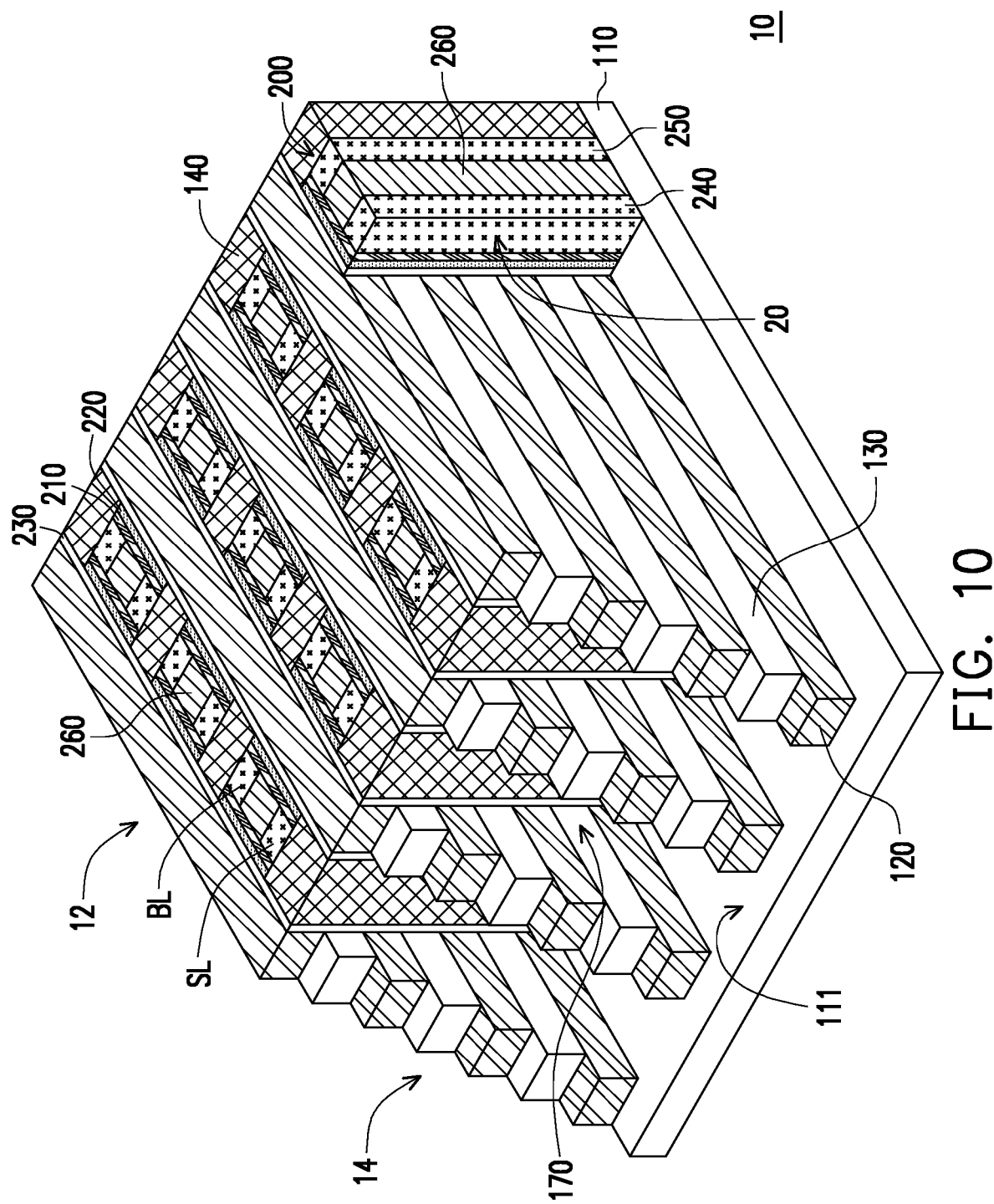
FIG. 10 is a schematic 3D view illustrating a memory device in accordance with some embodiments of the disclosure.

FIG. 10 is a schematic 3D view illustrating a memory device 10 in accordance with some embodiments of the disclosure. As illustrated in FIG. 10, the memory cell strings 21 are formed in the cell array region 12. Each of the memory cell strings 21 includes the memory cells 200 vertically aligned along the stacking direction of the stack 100 of the word line layers 120 and the insulating layers 130. Moreover, the staircase region 14 is disposed at opposite edges of the cell array region 12. The staircase region 14 in FIG. 10 is merely for illustration purpose and reducing the complexity of drawings. In some embodiments not illustrated, the staircase region 14 can be also disposed at more than one edge of the cell array region 12. In the present embodiment, the staircase region 14 is configured for electrically connecting the exposed world line layers 120 and a plurality of metal contacts (not shown) formed thereon. As shown in FIG. 10, lateral lengths of the stacked word line layers 120 along an extending direction thereof are gradually reduced from the lowest word line layer 120 to the topmost word line layer 120.

In accordance with some embodiments, a memory device includes a substrate, a plurality of word line layers, a plurality of insulating layers, and memory cells. The word line layers are stacked above the substrate. The insulating layers are stacked above the substrate respectively alternating with the word line layers. The memory cells are distributed along a stacking direction of the word line layers and the insulating layers perpendicularly to a major surface of the substrate. Each of the memory cells includes a source line electrode and a bit line electrode, a first oxide semiconductor layer, and a second oxide semiconductor layer. The source line electrode and the bit line electrode are laterally aligned along the word line layers and the insulating layers. The first oxide semiconductor layer is peripherally surrounded by one of the word line layers, the source line electrode, and the bit line electrode. The second oxide semiconductor layer is disposed between the one of the word line layers and the first oxide semiconductor layer.

In accordance with some embodiments, a memory array includes a substrate, a stack, a cell array region. The stack disposed above the substrate includes a plurality of word line layers and a plurality of insulating layers stacked in an alternated manner. The cell array region disposed in the stack includes a plurality of the memory cell strings. The memory cells strings are respectively disposed along a stacking direction of the stack. Each of the memory cell strings includes a source line electrode strip, a bit line electrode strip, a first oxide semiconductor electrode, and a second oxide semiconductor electrode. The source line electrode strip is extended perpendicularly to the major surface of the substrate. The bit line electrode strip is laterally aligned along the stacking direction with the source line electrode strip extended perpendicularly to the major surface of the substrate. The first oxide semiconductor layer is extended perpendicularly to the major surface of the substrate and peripherally surrounded by the word line layers, the insulting layers, and the source line electrode strip, and the bit lien electrode strip. The second oxide semiconductor layer is disposed between the word line layers and the first oxide semiconductor layer.

In accordance with some embodiments, a manufacturing method of a memory device includes forming a substrate. Moreover, word line layers and insulating layers are formed in alternation above the substrate. In addition, isolation trenches are formed to extend through the word line layers and the insulating layers perpendicularly to a major surface of the substrate and accommodate cell regions. The memory cells are respectively formed in the cell regions. The memory cells include the dual oxide semiconductor layer structures including first oxide semiconductor layers and second semiconductor layers are formed. The steps of forming the dual oxide semiconductor layer structures include forming the second oxide semiconductor layers along sidewalls of the isolation trenches and forming the first oxide semiconductor layers respectively on the second oxide semiconductor layers. Moreover, side wall oxide layers are formed and on the first oxide semiconductor layers. Moreover, source line electrodes and bit line electrodes are formed and extended along the first oxide semiconductor layers and the second oxide semiconductor layers. The side wall oxide layers are respectively surrounded by the source line electrodes, the bit line electrode, and the first oxide semiconductor layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a substrate;
a plurality of word line layers stacked above the substrate;
a plurality of insulating layers stacked above the substrate respectively alternating with the word line layers; and
a plurality of memory cells distributed along a stacking direction of the word line layers and the insulting layers perpendicularly to a major surface of the substrate, wherein each of the memory cells comprises:
a source line electrode and a bit line electrode laterally aligned along the word line layers and the insulating layers;
a first oxide semiconductor layer peripherally surrounded by one of the word line layers, the source line electrode, and the bit line electrode; and
a second oxide semiconductor layer disposed between the one of the word line layers and the first oxide semiconductor layer.

2. The memory device of claim 1, wherein each of the memory cells further comprises a high-k dielectric material layer disposed between the second oxide semiconductor layer and the one of the word line layers.

3. The memory device of claim 1, wherein a carrier concentration of the first oxide semiconductor layer is less than a carrier concentration of the second oxide semiconductor layer.

4. The memory device of claim 1, wherein the first oxide semiconductor layer is made of a material different from that of the second oxide semiconductor material.

5. The memory device of claim 1, wherein the first oxide semiconductor layer comprises oxygen compounds comprising Ga, Zn, and a metal selected from the group comprising Si, Mg, Ti, Ca, or the combination thereof.

6. The memory device of claim 1, wherein the second oxide semiconductor layer comprises oxygen compounds comprising In, Ga, Zn, and a metal selected from the group comprising Ti, Al, Ag, Si, Sn, or combination thereof.

7. The memory device of claim 1, a lateral thickness of the first oxide semiconductor layer is less than or equal to a lateral thickness of the second oxide semiconductor layer.

8. The memory device of claim 1, further comprising a cell array region and at least a staircase region, wherein the at least a staircase region is laterally disposed at an edge of the cell array region.

9. The memory device of claim 1, wherein lateral lengths along an extending direction of the word line layers are gradually reduced from the lowest word line layer to the topmost word line layer.

10. A memory array, comprising:
a substrate;
a stack, disposed above the substrate, comprising a plurality of word line layers and a plurality of insulating layers stacked in an alternated manner; and
a cell array region, disposed in the stack, comprising a plurality of memory cell strings respectively disposed along a stacking direction of the stack, wherein each of the memory cell strings comprises:
a source line electrode strip extended perpendicularly to the major surface of the substrate;
a bit line electrode strip laterally aligned along the stacking direction with the source line electrode strip extended perpendicularly to the major surface of the substrate;
a first oxide semiconductor layer extended perpendicularly to the major surface of the substrate and peripherally surrounded by the word line layers, the insulating layers, the source line electrode strip, and the bit line electrode strip; and
a second oxide semiconductor layer disposed between the word line layers and the first oxide semiconductor layer.

11. The memory array of claim 10, wherein a carrier concentration of the first oxide semiconductor layer is in a range from $10^{14}$ cm$^{-3}$ to $10^{15}$ cm$^{-3}$.

12. The memory array of claim 10, wherein a thickness of the first oxide semiconductor layer is less than or equal to a thickness of the second oxide semiconductor layer.

13. The memory array of claim 10, wherein a carrier concentration of the first oxide semiconductor layer is less than a carrier concentration of the second oxide semiconductor layer.

14. The memory array of claim 10, wherein a material of the first oxide semiconductor layer comprises an amorphous phase or a crystalline phase.

15. A manufacturing method of a memory device, comprising:
- forming a substrate;
- forming word line layers and insulating layers in alternation above the substrate;
- forming isolation trenches extending through the word line layers and the insulating layers perpendicularly to a major surface of the substrate for accommodating a plurality of cell regions therein; and
- forming a plurality of memory cells respectively in the cell regions, wherein the steps of forming the memory cells comprise:
  - forming dual oxide semiconductor layer structures including first oxide semiconductor layers and second semiconductor oxide layers, comprising:
    - forming the second oxide semiconductor layers along sidewalls of the isolation trenches;
    - forming the first oxide semiconductor layers respectively on the second oxide semiconductor layers;
    - forming side wall oxide layers on the first oxide semiconductor layers; and
    - forming source line electrodes and bit line electrodes extended along the first oxide semiconductor layers and the second oxide semiconductor layers, wherein the side wall oxide layers are respectively surrounded by the source line electrodes, the bit line electrodes, and the first oxide semiconductor layers.

16. The manufacturing method of claim 15, further comprising forming high-k dielectric material layers between the second oxide semiconductor layers and the word line layers.

17. The manufacturing method of claim 16, further comprising providing a photoresist mask overlaying a top surface of the first oxide semiconductor layers and the second oxide semiconductor layers for forming the isolation trenches.

18. The manufacturing method of claim 15, wherein a thickness of the first oxide semiconductor is less than a thickness of the second oxide semiconductor layer.

19. The manufacturing method of claim 15, further comprising filling an insulating oxide material in the isolation trenches to isolate each two memory cells disposed at opposite sides of the isolation trenches.

20. The manufacturing method of claim 15, further comprising forming a staircase region comprising a plurality of steps formed at a lateral end of the word line layers and the insulating layers by trimming and etching the word line layers and the insulating layers repeatedly.

* * * * *